(12) United States Patent
Lee et al.

(10) Patent No.: US 12,402,317 B2
(45) Date of Patent: Aug. 26, 2025

(54) SEMICONDUCTOR DEVICES AND DATA STORAGE SYSTEMS INCLUDING THE SAME

(71) Applicant: Samsung Electronics Co., Ltd., Suwon-si (KR)

(72) Inventors: Seungmin Lee, Seoul (KR); Junhyoung Kim, Seoul (KR); Kangmin Kim, Hwaseong-si (KR); Joonsung Lim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 579 days.

(21) Appl. No.: 17/852,812

(22) Filed: Jun. 29, 2022

(65) Prior Publication Data
US 2023/0080606 A1   Mar. 16, 2023

(30) Foreign Application Priority Data
Sep. 10, 2021   (KR) .................... 10-2021-0120940

(51) Int. Cl.
| | |
|---|---|
| H10B 43/40 | (2023.01) |
| H01L 23/528 | (2006.01) |
| H10B 41/10 | (2023.01) |
| H10B 41/27 | (2023.01) |
| H10B 41/35 | (2023.01) |
| H10B 41/40 | (2023.01) |

(Continued)

(52) U.S. Cl.
CPC ......... *H10B 43/40* (2023.02); *H01L 23/5283* (2013.01); *H10B 41/10* (2023.02); *H10B 41/27* (2023.02); *H10B 41/35* (2023.02); *H10B 41/40* (2023.02); *H10B 43/10* (2023.02); *H10B 43/27* (2023.02); *H10B 43/35* (2023.02); *H10B 43/50* (2023.02)

(58) Field of Classification Search
CPC ............................... H10B 41/50; H10B 43/50
See application file for complete search history.

(56) References Cited

U.S. PATENT DOCUMENTS

| | | |
|---|---|---|
| 10,388,666 B1 | 8/2019 | Kai et al. |
| 10,446,571 B2 | 10/2019 | Zhu et al. |

(Continued)

FOREIGN PATENT DOCUMENTS

| | | |
|---|---|---|
| CN | 107808884 A | 3/2018 |
| CN | 109256392 A | 1/2019 |

*Primary Examiner* — Alia Sabur
(74) *Attorney, Agent, or Firm* — Myers Bigel, P.A.

(57) ABSTRACT

A semiconductor device may include: a semiconductor substrate; a peripheral circuit structure on the semiconductor substrate; a plate pattern on the peripheral circuit structure and having a gap; and a stack structure on the plate pattern and including a first stack region and a second stack region. The first stack region may include gate electrodes stacked in a vertical direction perpendicular to an upper surface of the semiconductor substrate, and the second stack region may include both a conductor stack region including conductive layers stacked in the vertical direction and an insulator stack region including molded insulating layers at substantially the same height level as the conductive layers. The semiconductor device may also include vertical memory structure that extends through the first stack region; and source contact plugs electrically connected to at least one of the conductive layers of the conductor stack region and contacting the plate pattern.

20 Claims, 27 Drawing Sheets

(51) Int. Cl.
  *H10B 43/10*  (2023.01)
  *H10B 43/27*  (2023.01)
  *H10B 43/35*  (2023.01)
  *H10B 43/50*  (2023.01)

(56) References Cited

U.S. PATENT DOCUMENTS

| | | |
|---|---|---|
| 10,629,675 B1 | 4/2020 | Nishikawa et al. |
| 10,685,975 B2 | 6/2020 | Baek |
| 10,700,082 B2 | 6/2020 | Oike |
| 10,879,264 B1* | 12/2020 | Otsu .................. H10B 41/50 |
| 11,056,503 B2* | 7/2021 | Kim .................. H01L 23/5226 |
| 2015/0221667 A1* | 8/2015 | Fukuzumi .............. H10B 43/50 |
| | | 257/314 |
| 2017/0179151 A1* | 6/2017 | Kai .................. H01L 23/528 |
| 2020/0066742 A1* | 2/2020 | Kim .................. H10B 43/50 |
| 2020/0194453 A1* | 6/2020 | Lim .................. H10B 43/10 |
| 2021/0305271 A1* | 9/2021 | Kim .................. H10B 43/27 |

* cited by examiner

SEMICONDUCTOR DEVICES AND DATA STORAGE SYSTEMS INCLUDING THE SAME

CROSS-REFERENCE TO RELATED APPLICATION(S)

This application claims benefit of priority to Korean Patent Application No. 10-2021-0120940 filed on Sep. 10, 2021, in the Korean Intellectual Property Office, the entire contents of which are incorporated by reference herein.

TECHNICAL FIELD

The present disclosure relates to semiconductor devices and to data storage systems including the same.

BACKGROUND

There has been increasing demand for semiconductor devices that store high-capacity data for use in electronic systems that require data storage capabilities. Accordingly, there have been studies into measures for increasing the data storage capacity of semiconductor devices. For example, one proposed method for increasing data storage capacity of a semiconductor device uses a semiconductor device including memory cells arranged three-dimensionally instead of memory cells arranged two-dimensionally.

SUMMARY

Some aspects of the present disclosure provide semiconductor devices exhibiting improved electrical performance and/or having increased integration density. Some aspects of the present disclosure provide data storage systems that include semiconductor devices exhibiting improved electrical performance and/or having increased integration density.

According to some example embodiments, a semiconductor device may include: a semiconductor substrate; a peripheral circuit structure on the semiconductor substrate; a plate pattern on the peripheral circuit structure and having a gap; and a stack structure on the plate pattern and including a first stack region and a second stack region spaced apart from the first stack region. The first stack region may include gate electrodes stacked in a vertical direction that is perpendicular to an upper surface of the semiconductor substrate, and the second stack region may include both a conductor stack region including conductive layers stacked in the vertical direction and an insulator stack region including molded insulating layers at substantially the same height level as the conductive layers. The semiconductor device may also include a vertical memory structure that extends through the first stack region; and source contact plugs electrically connected to at least one of the conductive layers of the conductor stack region and contacting the plate pattern.

According to some example embodiments, a semiconductor device may include: a semiconductor substrate; a peripheral circuit structure on the semiconductor substrate; a plate pattern on the peripheral circuit structure and having gaps spaced apart from each other; and a stack structure on the plate pattern and including first stack regions spaced apart from each other and second stack regions spaced apart from each other. Each of the first stack regions may include gate electrodes stacked in a vertical direction perpendicular to an upper surface of the semiconductor substrate, and each of the second stack regions may include both a conductor stack region including conductive layers stacked in the vertical direction, and an insulator stack region including molded insulating layers at substantially the same height level as the conductive layers. The semiconductor device may include vertical memory structures that extend through the first stack regions; source contact plugs that extend through the second stack regions; separation structures that extend through the stack structure; source connection lines having a higher level than the stack structure; and bitlines having a higher level than the stack structure. When viewed in a plan view, each of the gaps may have a line shape or a bar shape that extends in a first direction that is parallel to the upper surface of the semiconductor substrate. When viewed in the plan view, the first and second stack regions are spaced apart from each other in a second direction that is parallel to the upper surface of the semiconductor substrate and perpendicular to the first direction. The insulator stack regions of the second stack regions may overlap the gaps. In each of the second stack regions, at least one of the conductive layers of the second stack region may be electrically connected to the source contact plugs that extend through the second stack region. Each of the source connection lines may have a line shape that extends in the second direction. Each of the bitlines may have a line shape that extends in the second direction. The source contact plugs may include first source contact plugs that overlap the source connection lines, and second source contact plugs that overlap the bitlines.

According to some example embodiments, a data storage system may include: a semiconductor device including an input/output pattern; and a controller electrically connected to the semiconductor device through the input/output pattern and configured to control the semiconductor device. The semiconductor device may include: a semiconductor substrate; a peripheral circuit structure on the semiconductor substrate; a plate pattern on the peripheral circuit structure and having gaps spaced apart from each other; and a stack structure on the plate pattern and including first stack regions spaced apart from each other and second stack regions spaced apart from each other. Each of the first stack regions may include gate electrodes stacked in a vertical direction that is perpendicular to an upper surface of the semiconductor substrate, and each of the second stack regions may include both a conductor stack region including conductive layers stacked in the vertical direction, and an insulator stack region including molded insulating layers at substantially the same height level as the conductive layers. The semiconductor device may also include vertical memory structures that extend through the first stack regions; source contact plugs that extend through the second stack regions; separation structures that extend through the stack structure; source connection lines having a higher level than the stack structure; and bitlines having a higher level than the stack structure. When viewed in a plan view, each of the gaps may have a line shape or a bar shape that extends in a first direction that is parallel to the upper surface of the semiconductor substrate. When viewed in the plan view, the first and second stack regions may be spaced apart from each other in a second direction that is parallel to the upper surface of the semiconductor substrate and perpendicular to the first direction. The insulator stack regions of the second stack regions may overlap the gaps. In each of the second stack regions, at least one of the conductive layers of the second stack region may be electrically connected to the source contact plugs penetrating through the second stack region. Each of the source connection lines may have a line shape that extends in the second direction. Each of the bitlines may have a line shape that extends in the second direction. The source contact plugs may include first source contact plugs that overlap the source connection lines, and second source contact plugs that overlap the bitlines.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, some example embodiments will be described with reference to the accompanying drawings. Hereinafter, terms such as "up," "upper portion," "upper surface," "down," "lower portion," "lower surface," "side surface," etc., may be understood with reference to the accompanying drawings. Terms such as "upper," "middle," and "lower" may be replaced with other terms, e.g., "first," "second," and "third," etc., to be used to describe elements of the specification. Terms such as "first" and "second" may be used to describe various elements, but the elements are not limited by the terms, and a "first element" may be referred to herein interchangeably as a "second element," as appropriate.

Figure 1:
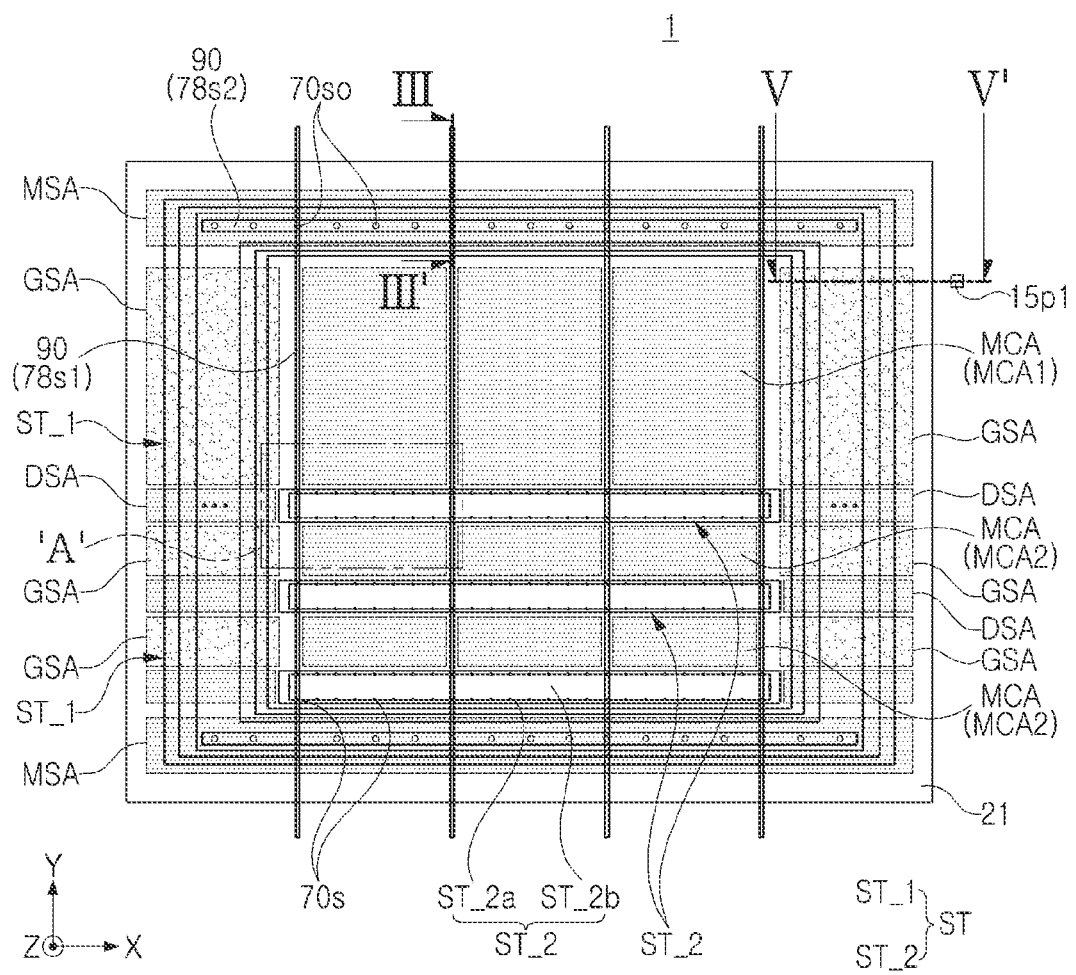
FIGS. 1 to 5B are diagrams illustrating an example of a semiconductor device according to some example embodiments.
Figure 2:
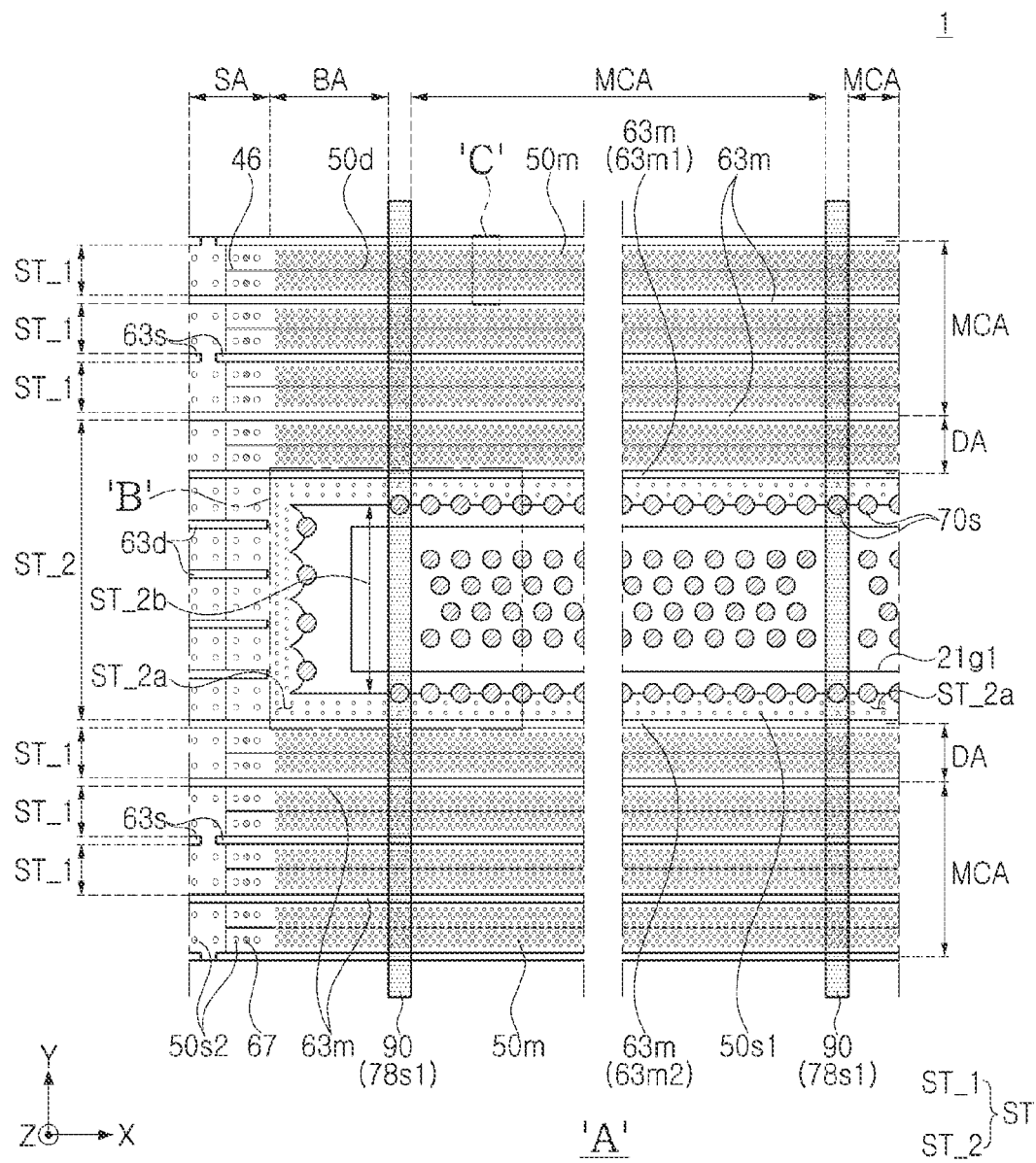
Figure 3A:
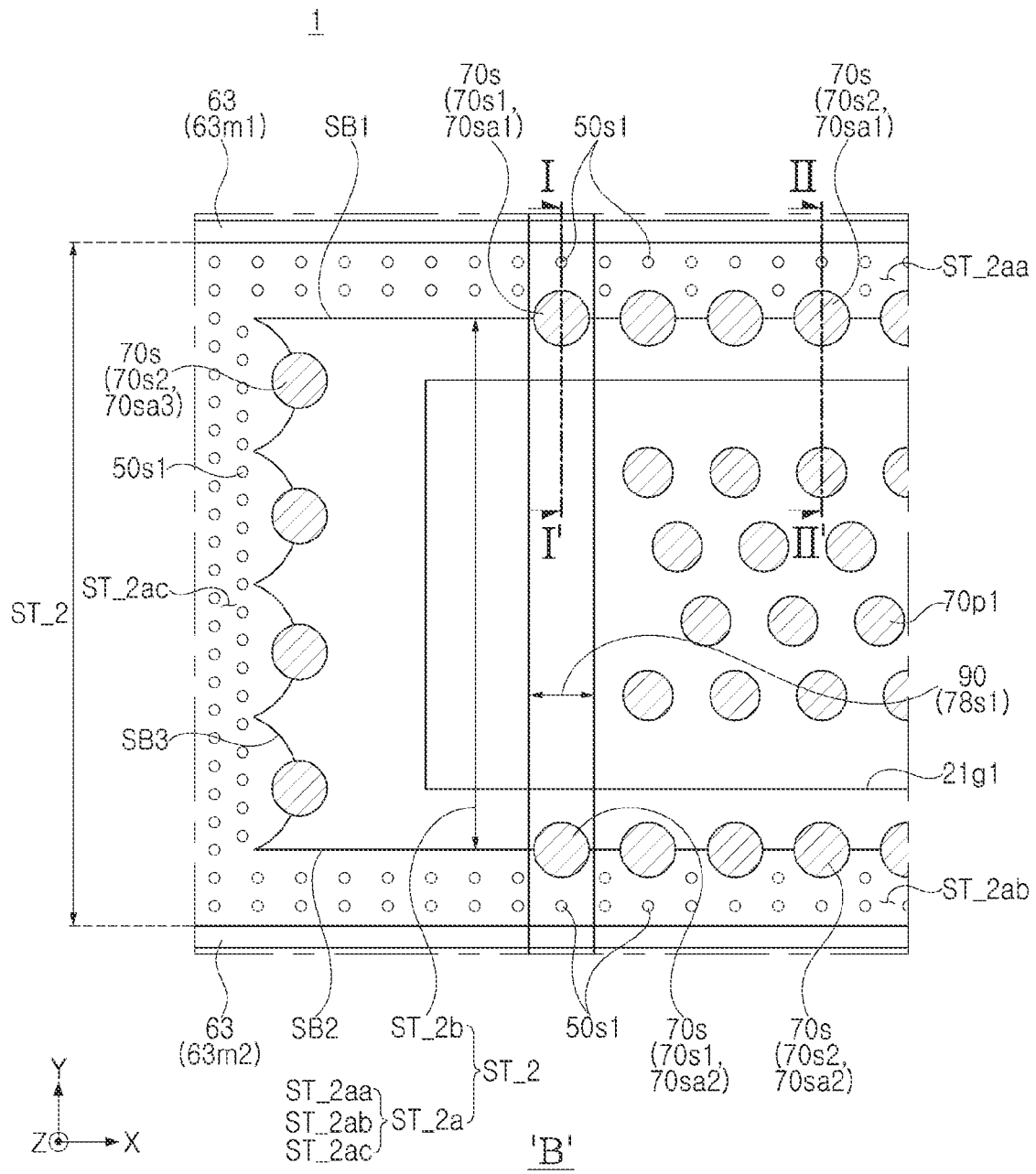
Figure 3B:
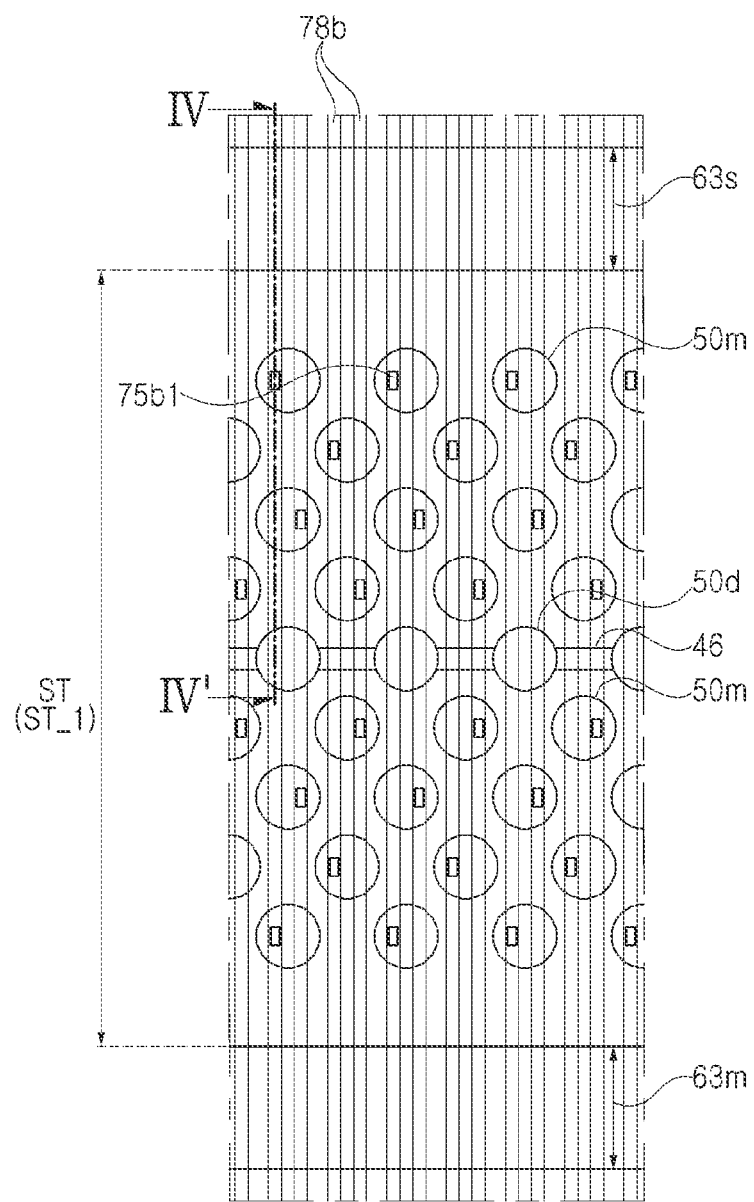
Figure 4A:
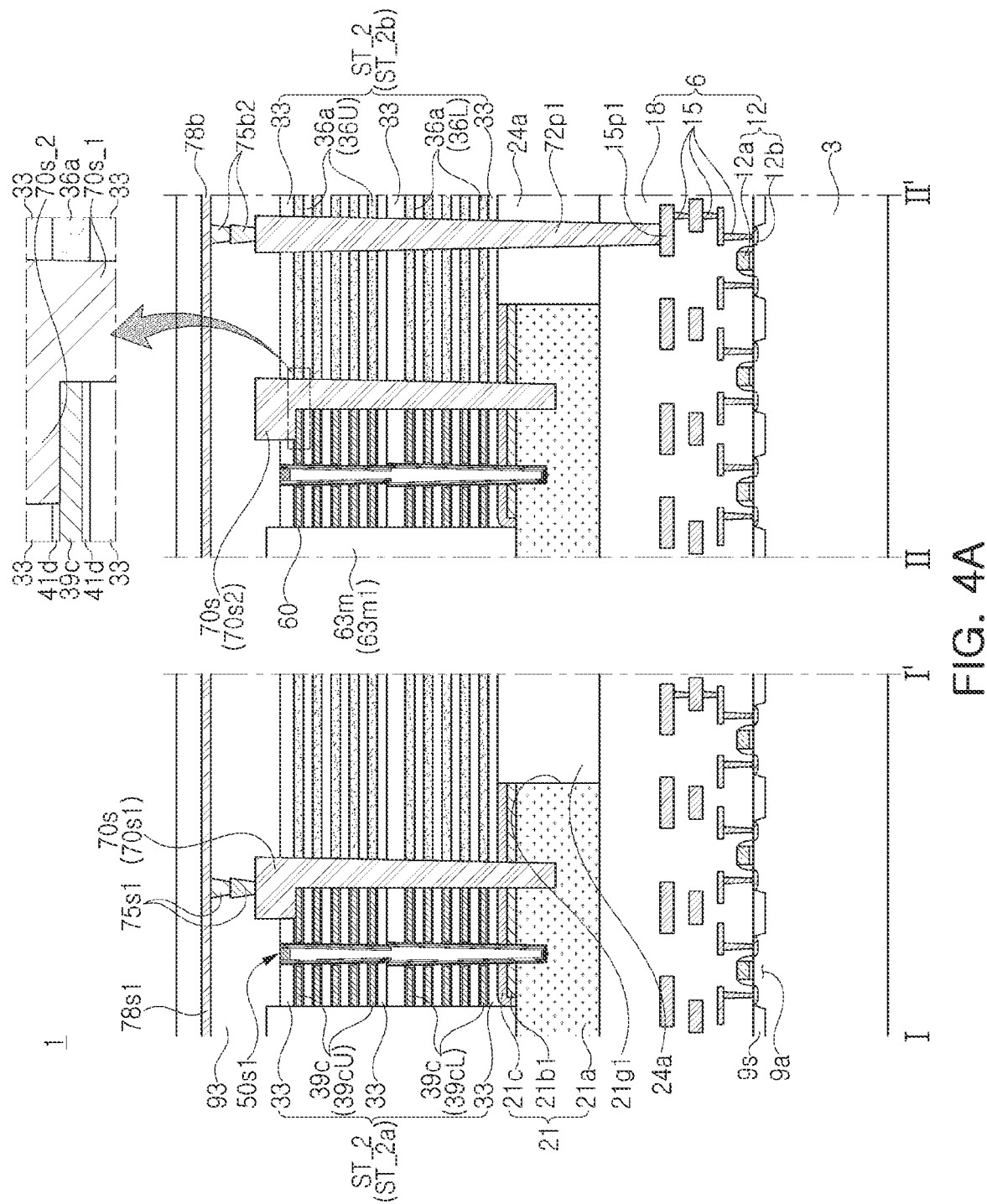
Figure 4B:
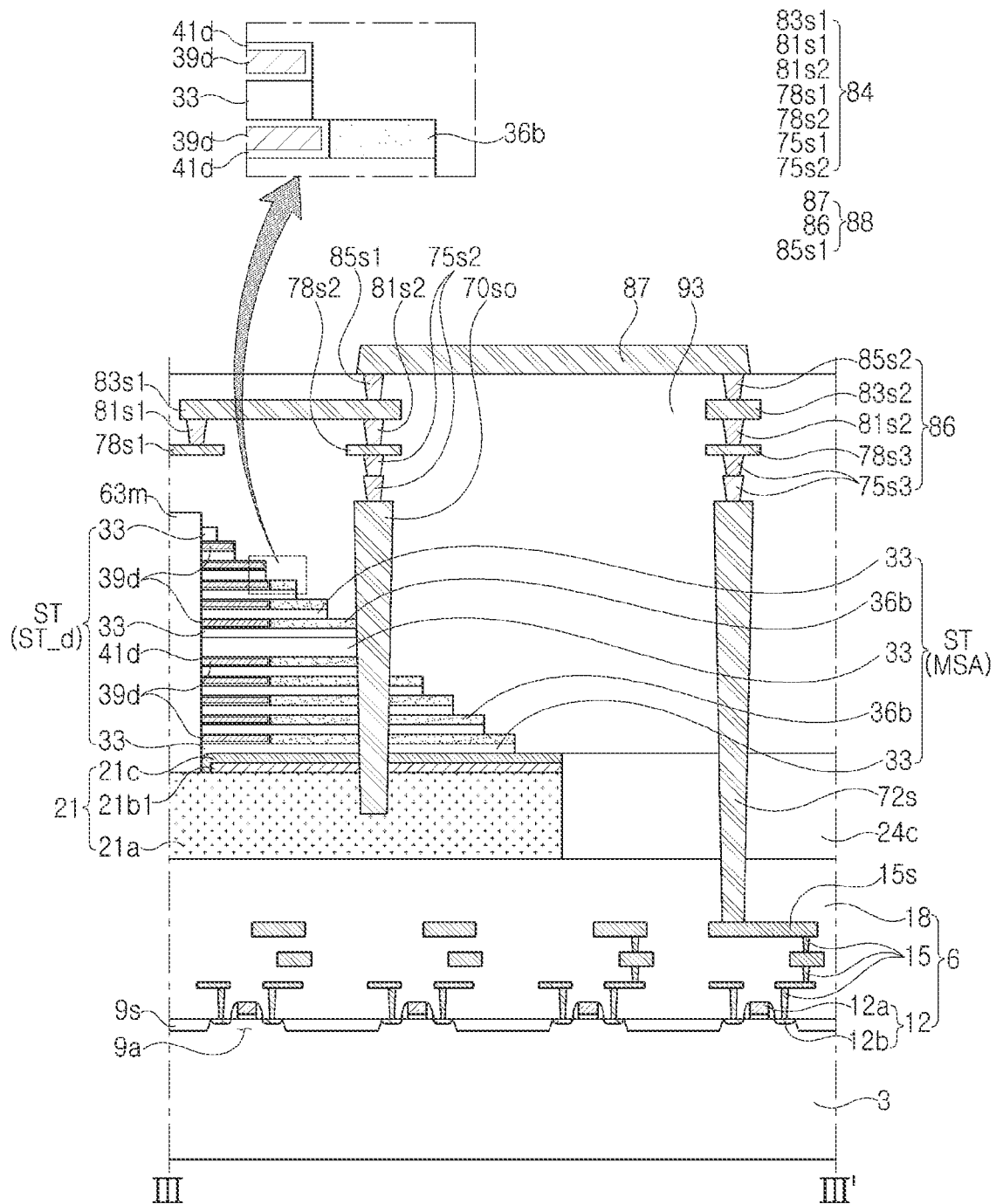
Figure 4C:
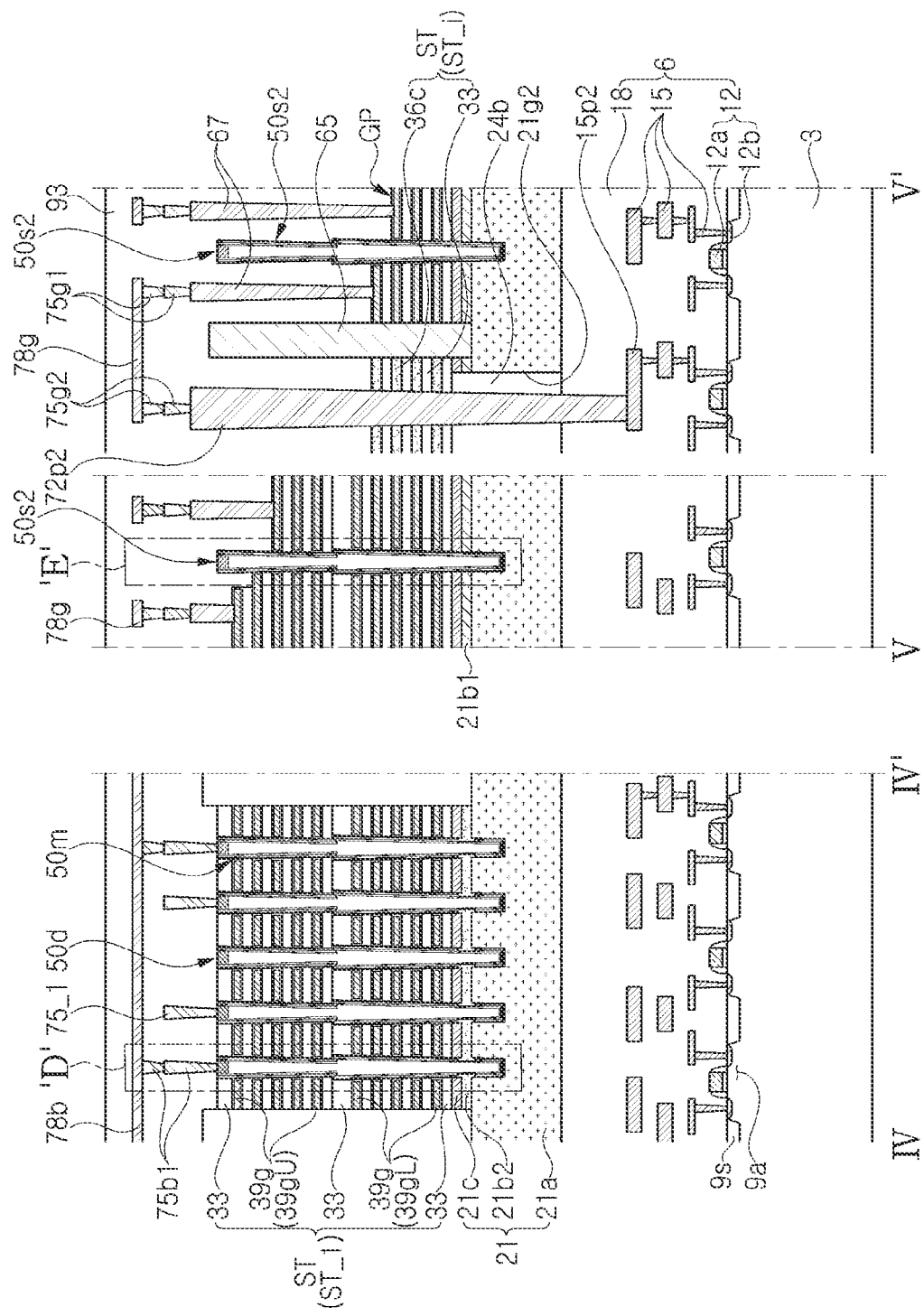

An example of a semiconductor device according to some example embodiments will be described with reference to FIGS. 1, 2, 3A, 3B, 4A, 4B, and 4C. FIG. 1 is plan view illustrating an example of a semiconductor device according to some example embodiments, and FIG. 2 is an enlarged plan view of region "A" of FIG. 1, FIG. 3A is an enlarged plan view of region "B" of FIG. 2, FIG. 3B is an enlarged plan view of region "C" of FIG. 2, FIG. 4A is a cross-sectional view illustrating regions taken along lines I-I' and II-II' of FIG. 3A, FIG. 4B is a cross-sectional view illustrating regions taken along line of FIG. 1, and FIG. 4C is a cross-sectional view illustrating regions taken along line IV-IV' of FIG. 3B and line V-V' of FIG. 1.

Referring to FIGS. 1 to 4C, a semiconductor device 1 according to some example embodiments may include a semiconductor substrate 3, a peripheral circuit structure 6 on the semiconductor substrate 3, a stack structure ST including a plate pattern 21 having gaps 21g1 and 21g2, and a first stack region ST_1 and a second stack region ST_2, on the plate pattern 21 and spaced apart from each other, on the peripheral circuit structure 6, Vertical memory structures 50m may penetrate or extend through at least the stack structure ST and may contact the plate pattern 21, and source contact plugs 70s may penetrate or extend through the stack structure ST and may contact the plate pattern 21.

The semiconductor device 1 according to some example embodiments may further include first and second vertical support structures 50s1 and 50s2 and vertical dummy structures 50d that may penetrate or extend through at least the stack structure ST and may be in contact with the plate pattern 21. The first and second vertical support structures 50s1 and 50s2 and the vertical dummy structures 50d may be dummy structures electrically insulated from a bitline 78b. The first and second vertical support structures 50s1 and 50s2 and the vertical dummy structures 50d may serve as supports to prevent collapse or deformation of the stacked structure ST. The peripheral circuit structure 6 may include a peripheral circuit 12 on the semiconductor substrate 3, a peripheral interconnection structure 15 electrically connected to the peripheral circuit 12 on the semiconductor substrate 3, and a lower insulating structure 18 covering the peripheral circuit 12 and the peripheral interconnection structure 15 on the semiconductor substrate 3. The peripheral circuit 12 may include a peripheral transistor including source/drain regions 12b and a peripheral gate 12a. The source/drain regions 12b may be in an active region 9a defined by an isolation region 9s on the semiconductor substrate 3 The peripheral gate 12a may be on the active region 9a between the source/drain regions 12b. The peripheral interconnection structure 15 may include a first peripheral pad 15p1, a second peripheral pad 15p2, and a source pad 15s.

The plate pattern 21 may include a silicon layer, for example, a polysilicon layer. At least a portion of the plate pattern 21 may be a common source in a flash memory device.

The plate pattern 21 may include a lower layer 21a, a first intermediate layer 21b1 and a second intermediate layer 21b2 at the same height level on the lower layer 21a, and an upper layer 21c that covers the first and second intermediate layers 21b1 and 21b2 on the lower layer 21a.

The lower layer 21a may include a doped polysilicon layer, for example, a polysilicon layer having a first conductivity type (e.g., N-type conductivity). The first intermediate layer 21b1 may include a single layer or a plurality of layers. For example, the first intermediate layer 21b1 may include a silicon oxide layer, a silicon nitride layer, and a silicon oxide layer stacked in order. The second intermediate layer 21b2 may include a doped polysilicon layer, for example, a polysilicon layer having the first conductivity type (e.g., N-type conductivity). The upper layer 21c may include a doped polysilicon layer, for example, a polysilicon layer having the first conductivity type (e.g., N-type conductivity). The first intermediate layer 21b1 may be spaced apart from separation structures 63m, 63s, and 63d, and the second intermediate layer 21b2 may be in contact with the separation structures 63m and 63s. A region, for example formed of polysilicon having the first conductivity type (e.g., N-type conductivity), in the plate pattern 21 may be a common source of a flash memory device.

The stacked structure ST may include a first stack region ST_1 and a second stack region ST_2.

In the stack structure ST, the first stack region ST_1 may include gate electrodes 39g stacked in a vertical direction Z that is perpendicular to an upper surface of the semiconductor substrate 3. The first stack region ST_1 may further include interlayer insulating layers 33 repeatedly and alternately stacked with the gate electrodes 39g. The first stack region ST_1 may further include a dielectric layer (41d of FIGS. 5A and 5B) covering upper and lower surfaces of each of the gate electrodes 39g and covering a portion of a side surface of each of the gate electrodes 39g.

In the stack structure ST, the second stack region ST_2 may include a conductor stack region ST_2a, including conductive layers 39c stacked in the vertical direction Z, and an insulator stack region ST_2b including molded-insulating layers 36a at substantially the same height level as the conductive layers 39c.

The conductor stack region ST_2a may further include interlayer insulating layers 33 repeatedly and alternately stacked with the conductive layers 39c. The conductor stack region ST_2a may further include a dielectric layer (41d of FIG. 4A) covering an upper surface and a lower surface of each of the conductive layers 39c and covering a portion of a side surface of each of the gate electrodes 39g. The insulator stack region ST_2b may further include interlayer insulating layers 33 repeatedly and alternately stacked with the molded insulating layers 36a.

The interlayer insulating layers 33 may be formed of silicon oxide. The gate electrodes 39g and the conductive layers 39c may be formed of the same conductive material. The gate electrodes 39g and the conductive layers 39c may include at least one of doped polysilicon, metal nitride (for example, titanium nitride (TiN), or the like), a metal-semiconductor compound (for example, titanium silicon (TiSi), nickel silicon (NiSi), or the like), and/or a metal (for example, tungsten (W), or the like). The dielectric layer 41d may be formed of silicon oxide or a high-k dielectric (for example, aluminum oxide (AlO), or the like). The molded insulating layers 36a may be formed of silicon nitride.

The stack structure ST may include a mold staircase region MSA and a dummy staircase region ST_d between the mold staircase region MSA and the first stack region ST_1. The dummy staircase region ST_d may further include interlayer insulating layers 33 and the dummy gate electrodes 39d, repeatedly and alternately stacked, and a dielectric layer (41d of FIG. 4B) covering an upper surface and a lower surface of each of the dummy gate electrodes 39d and covering a portion of a side surface of each of the dummy gate electrodes 39d. The dummy gate electrodes 39d may be formed of the same material as the gate electrodes 39g and the conductive layers 39c.

The mold staircase region MSA may include interlayer insulating layers 33 and molded insulating layers 36b repeatedly and alternately stacked. The molded insulating layers 36b may be formed of silicon nitride.

In the stack structure ST, the dummy staircase region ST_d and the mold staircase region MSA may have a staircase shape.

When viewed from the plan view of FIG. 1 in the stack structure ST, the dummy staircase region ST_d and the mold staircase region MSA may be above and/or below a stack region including the first stack region ST_1 and the second stack region ST_2.

When viewed from the plan view of FIG. 1 in the stack structure ST, the first and second stack regions ST_1 and ST_2 may include a central region having a planar upper surface and staircase regions SA on the left and right of the central region and having a staircase of which height is decreased.

The staircase region SA of the first stack region ST_1 may be referred to as a gate staircase region GSA, and the staircase region SA of the second stack region ST_2 may be referred to as a dummy staircase region DSA. For example, in the gate staircase region GSA of the first stack region ST_1, the gate electrodes 39g may have gate pads GP arranged in a staircase shape and the second stack region may have gate pads GP arranged in a staircase shape. The conductive layers 39c in the dummy staircase region DSA of the region ST_2 may have a staircase shape.

The gate staircase region GSA of the first stack region ST_1 may further include an insulator stack region ST_i. In the first stack region ST_1, the insulator stack region ST_i may include interlayer insulating layers 33 and molded insulating layers 36c alternately stacked. The molded insulating layers 36c may be formed of silicon nitride.

The semiconductor device 1 according to some example embodiments may further include a dam structure 65 that penetrates or extends through the gate staircase region GSA and surrounds the insulator stack region ST_i on the plate pattern 21. The gate electrodes 39g may be spaced apart from the molded insulating layers 36c by the dam structure 65.

In the plate pattern 21, the gaps 21g1 and 21g2 may include a first gap 21g1 below the insulator stack region ST_2b of the second stack region ST_2 and a second gap 21g2 below the insulator stack region ST_i of the gate staircase region GSA of the first stack region ST_1.

The first gap 21g1 may have a line shape or a bar shape extending in a first direction X. The insulator stack region ST_2b of the second stack region ST_2 may cover the entire first gap 21g1 and may have a greater width than the first gap 21g1.

The semiconductor device 1 according to some example embodiments may further include a first intermediate gap-fill pattern 24a within the first gap 21g1, a second intermediate gap-fill pattern 24b within the second gap 21g2, and an intermediate insulating layer 24c on an external side surface of the plate pattern 21. The first intermediate gap-fill pattern 24a, the second intermediate gap-fill pattern 24b, and the intermediate insulating layer 24c may be formed of e.g., silicon oxide.

The semiconductor device 1 according to some example embodiments may further include a capping insulating structure 93 on the stack structure ST and the intermediate insulating layer 24*c*.

The vertical memory structures 50*m* and the vertical dummy structures 50*d* may penetrate through a central region of the first stack region ST_1 that has a planar upper surface.

The first vertical support structures 50*s*1 may penetrate through the conductor stack region ST_2*a* in a central region of the first stacking region ST_2 that has a planar upper surface.

The second vertical support structures 50*s*2 may penetrate through the staircase region SA of the first and second stack regions ST_1 and ST_2.

The semiconductor device 1 according to an example embodiment may further include separation structures 63*m*, 63*s*, and 63*d* penetrating through the stack structure ST.

The separation structures 63*m*, 63*s*, and 63*d* may include main separation structures 63*m* that intersect the stack structure ST in the first direction X and separate the stack structure ST in a second direction Y, auxiliary separation structures 63*s* between the main separation structures 63*m* and having a width smaller than a width of the stack structure ST in the first direction X, and dummy separation structures 63*d* that penetrate through the staircase region SA the second stacking region ST_2.

The first direction X may be parallel to the upper surface of the semiconductor substrate 3, and the second direction Y may be parallel to the upper surface of the semiconductor substrate 3 and perpendicular the first direction X.

The main separation structures 63*m* may include a first main separation structure 63*m*1 and a second main separation structure 63*m*2 spaced apart from each other with the second stack region ST_2 interposed therebetween. In the stack region ST, a plurality of the second stack regions ST_2 may be spaced apart from each other in the second direction Y. Each of the plurality of second stack regions ST2 may be in the form of a bar or a line extending in the first direction X.

The conductor stack region ST_2*a* of the second stack region ST_2 may include a first stack portion (ST_2*aa* of FIG. 3A) between the first main separation structure 63*m*1 and the insulator stack region ST_2*b*, a second stack portion (ST_2*ab* of FIG. 3A) between the second main separation structure 63*m*2 and the insulator stacking region ST_2*b*, and a third stack portion (ST_2*ac* of FIG. 3A) connecting the first stack portion (ST_2*aa* of FIG. 3A) and the second stack portion (ST_2*ab* of FIG. 3A) to each other.

When viewed from plan view on a height level on which one of the conductive layers 39*c* is disposed, the third stack portion (ST_2*ac* of FIG. 3A) may include convex portions in a direction toward the insulator stack region ST_2*b*.

When viewed from plan view on a height level on which one of the conductive layers 39*c* is positioned, a first boundary SB1 between the first stack portion (ST_2*aa* of FIG. 3A) and the insulator stack region ST_2*b* and a second boundary SB2 between the second stack portion (ST_2*ab* of FIG. 3A) and the insulator stack region ST_2*b* may be in the form of a line extending in the first direction X. A third boundary SB3 between the third stack portion (ST_2*ac* of FIG. 3A) and the insulator stack region ST_2*b* may be in the form of a curved surface or of curved surfaces.

The source contact plugs 70*s* may be electrically connected to at least one of the conductive layers 39*c* of the conductor stack region ST_2*a* and may be in contact with the plate pattern 21. For example, the source contact plugs 70*s* may penetrate through the upper layer 21*c* and the first intermediate layer 21*b* of the plate pattern 21 to be in contact with the lower layer 21*a*. The source contact plugs 70*s* may be in contact with the plate pattern 21 which may be a common source of a flash memory device.

At least one of the source contact plugs 70*s* may penetrate between the insulator stack region ST_2*b* and the conductor stack region ST_2*a* and may contact the plate pattern 21.

At least one of the source contact plugs 70*s* may be in contact with an uppermost conductive layer, among the conductive layers 39*c* of the conductor stack region ST_2*a*. At least one of the source contact plugs 70*s* may be in contact with a plurality of conductive layers among the conductive layers 39*c*, and a plurality of mold insulation layers among the molded insulating layers 36*a*.

At least one of the conductive layers 39*c* may have an upper surface and a side surface in contact with at least one of the source contact plugs 70*s*. For example, at least one of the source contact plugs 70*s* may be in contact with an upper surface and a side surface of an uppermost conductive layer, among the conductive layers 39*c*.

As seen in FIG. 3A, the source contact plugs 70*s* may include first side source contact plugs 70*sa*1 electrically connected to at least one of the conductive layers 39*c* of the first stack portion ST_2*aa*, second side source contact plugs 70*sa*2 electrically connected to at least one of the conductive layers 39*c* of the second stack portion ST_2*ab*, and third side source contact plugs 70*sa*3 electrically connected to at least one of the conductive layers 39*c* of the third stack portion ST_2*ac*. The first source connection line 78*s*1 may overlap at least one of the first side source contact plugs 70*sa*1, and may overlap at least one of the second side source contact plugs 70*sa*2.

The semiconductor device 1 according to some example embodiments may further include external source contact plugs 70*so* in contact with the plate pattern 21, as seen in FIG. 4B. The external source contact plugs 70*so* may penetrate through the mold staircase region MSA of the stack structure ST and the upper layer 21*c* and the first intermediate layer 21*b*1 of the plate pattern 21, and may be in contact with the lower layer 21*a* of the plate pattern 21.

The semiconductor device 1 according to some example embodiments may further include a first peripheral contact plug 72*p*1 penetrating through the insulator stack region ST_2*b* and the first intermediate gap-fill pattern 24*a* of the second stack region ST_2. The first peripheral contact plug 72*p*1 may be electrically connected to the first peripheral pad 15*p*1 of the peripheral circuit structure 6.

The semiconductor device 1 according to some example embodiments may further include a second peripheral contact plug 72*p*2 penetrating through the insulator stack region ST_i and the second intermediate gap-fill pattern 24*b* of the first stack region ST_1. The second peripheral contact plug 72*p*2 may be electrically connected to the second peripheral pad 15*p*2 of the peripheral circuit structure 6.

The semiconductor device 1 according to some example embodiments may further include a third peripheral contact plug 72*s* that may penetrate or extend through the intermediate insulating layer 24*c* and may be electrically connected to the source pad 15*s*. The third peripheral contact plug 72*s* may be referred to as a source peripheral contact plug.

The first to third peripheral contact plugs 72*p*1, 72*p*2, and 72*s* and the source contact plugs 70*s* may have upper surfaces at substantially the same height level. Lower surfaces of the first to third peripheral contact plugs 72*p*1, 72*p*2, and 72*s* may be arranged at a lower level than lower surfaces of the source contact plugs 70*s*.

The first to third peripheral contact plugs 72p1, 72p2, and 72s, the source contact plugs 70s, and the external source contact plugs 70so may be formed of the same material. For example, the first to third peripheral contact plugs 72p1, 72p2, and 72s, the source contact plugs 70s, and the external source contact plugs 70so may include at least one of a metal nitride (for example, titanium nitride (TiN), tantalum nitride (TaN), tungsten nitride (WN), or the like) and/or a metal (for example, tungsten (W), or the like).

The semiconductor device 1 according to an example embodiment may further include a bitline 78b at a higher level than the stack structure ST.

The bitline 78b may have a line shape extending in the second direction Y, and may intersect the first and second stack regions ST_1 and ST_2.

The semiconductor device 1 according to an example embodiment may further include first bitline connection plug 75b1, electrically connecting the vertical memory structure 50m and the bitline 78b to each other and between the vertical memory structure 50m and the bitline 78b, and a second bitline connection plug 75b2 electrically connecting the first peripheral contact plug 72p1 and the bitline 78b to each other and between the first peripheral contact plug 72p1 and the bitline 78b.

The first and second bitline connection plugs 75b1 and 75b2 may include a first plug (e.g., 75_1 of FIG. 5A) and a second plug (e.g., 75_2 of FIG. 5A) stacked in order.

The semiconductor device 1 according to some example embodiments may further include a first source connection line 78s1 and a source connection pattern 75s1 on the stack structure ST.

The first source connection line 78s1 may have a line shape extending in the second direction Y.

A plurality of first source connection line 78s1 may be disposed to be spaced apart from each other in the first direction X. Hereinafter, a single first source connection line 78s1 will mainly be described.

The source contact plugs 70s include at least one first source contact plug 70s1, which overlaps the first source connection line 78s1, and second source contact plugs 70s2 which do not overlap the first source connection line 78s1. At least one of the second source contact plugs 70s2 may overlap the bitline 78b.

The source connection pattern 75s1 may electrically connect the first source connection line 78s1 and the at least one first source contact plug 70s1 to each other.

A width of the first source connection line 78s1 may be greater than a width of the bitline 78b.

The width of the first source connection line 78s1 may be about three times to about ten times greater than the width of the bitline 78b.

As illustrated in FIG. 4B, the semiconductor device 1 according to some example embodiments may further include a second source connection line 78s2, extending in the first direction X on a higher level than the stack structure S, and a second source connection patterns 75s2 electrically connecting the second source connection line 78s and the external source contact plugs 70so between the source connection line 78s and the external source contact plugs 70so.

As illustrated in FIG. 4B, the semiconductor device 1 according to some embodiments may further include a first upper connection line 83s1 on a higher level than the first and second source connection lines 78s1 and 78s2, a plug 81s1 electrically connecting the first upper connection line 83s1 and the first source connection line 78s1 and between the upper connection line 83s1 and the first source connection line 78s1, and a plug 81s2 electrically connecting the first upper connection line 83s1 and the second source connection line 78s2 and between the first upper connection line 83s1 and the second source connection line 78s2.

The source connection patterns 75s1 and 75s2, the first and second source connection lines 78s1 and 78s2, the plugs 81s1 and 81s2, and the first upper connection line 83s1 may be defined as a first interconnection structure 84 for electrically connecting the source contact plugs 70s and the external source contact plugs 70so to each other.

As illustrated in FIG. 4B, the semiconductor device 1 according to some example embodiments may further include a second interconnection structure 88 electrically connecting the first interconnection structure 84 and the third peripheral contact plug 72s to each other. The second interconnection structure 88 may include a second upper connection line 87, a plug 85s1 electrically connecting the second upper connection line 87 and the first upper connection line 83s1 and between the second upper connection line 87 and the first upper connection line 83s1, and a plurality of plugs 75s3, 78s3, 81s2, 83s2, and 85s2 electrically connecting the second upper connection line 87 and the third peripheral contact plugs 72s and between the second upper connection line 87 and the third peripheral contact plugs 72s.

Accordingly, an interconnection structure 84 and 88 electrically connecting the source contact plugs 70s, the external source contact plugs 70so, and the third peripheral contact plugs 72s may include the first interconnection structure 84 and the second interconnection structure 88.

In the semiconductor device 1 according to some example embodiments, the plate pattern 21, which may be a common source of a flash memory device, may be electrically connected to the peripheral circuit of the peripheral circuit structure 6 through the source contact plugs 70s in contact with the plate pattern 21, at least one of the conductive layers 39c in contact with the source contact plugs 70s, and the external source contact plugs 70so. Accordingly, the common source of the plate pattern 21 may be electrically connected to the peripheral circuit of the peripheral circuit structure 6 through the source contact plugs 70s in contact with at least one of the conductive layers 39c to address a noise issue occurring when the common source and the peripheral circuit are electrically connected to each other in the flash memory device. As a result, noise may be prevented from being generated by the common source in an operation, for example, in a read operation, of the flash memory device.

The semiconductor device 1 according to some example embodiments may further include gate contact plugs 67 on the gate pads GP of the gate electrodes 39g, gate interconnections 78g having a higher level than the gate contact plugs 67, first gate connection plugs 75g1 between the gate interconnections 78g and the gate contact plugs 67, and second gate connection plugs 75g2 between the gate interconnections 78g and the second peripheral contact plugs 72p2.

The semiconductor device 1 may include a memory cell array region 1, a buffer region BA, and a dummy region DA. The memory cell array region MCA may be a region in which the vertical memory structures 50m are arranged. Alternatively, a portion of the first stack region ST_1 of the stack structure ST, in which the vertical memory structures 50m are arranged, may be defined as a memory cell array region MCA. The buffer region BA may be a region between the memory cell array region MCA and the staircase region SA, and the dummy region DA may be a region between the memory cell array region MCA and the second stack region ST_2. The dummy vertical structures 50d may be disposed in the buffer region BA and the dummy region DA.

In the plan view of FIG. 1, a plurality of first source connection lines 78s1 may be disposed. The memory cell array region MCA may include first memory cell array regions MCA1 and second memory cell array regions MCA2. The first memory cell array regions MCA1 and the second memory cell array regions MCA2 may be disposed between the first source connection lines 78s1. The second memory cell array regions MCA2 may be disposed between the second stack regions ST_2.

A width of each of the first memory cell array regions MCA1 in the second direction Y may be greater than a width of each of the second memory cell array regions MCA2 in the second direction Y.

Figure 5A:
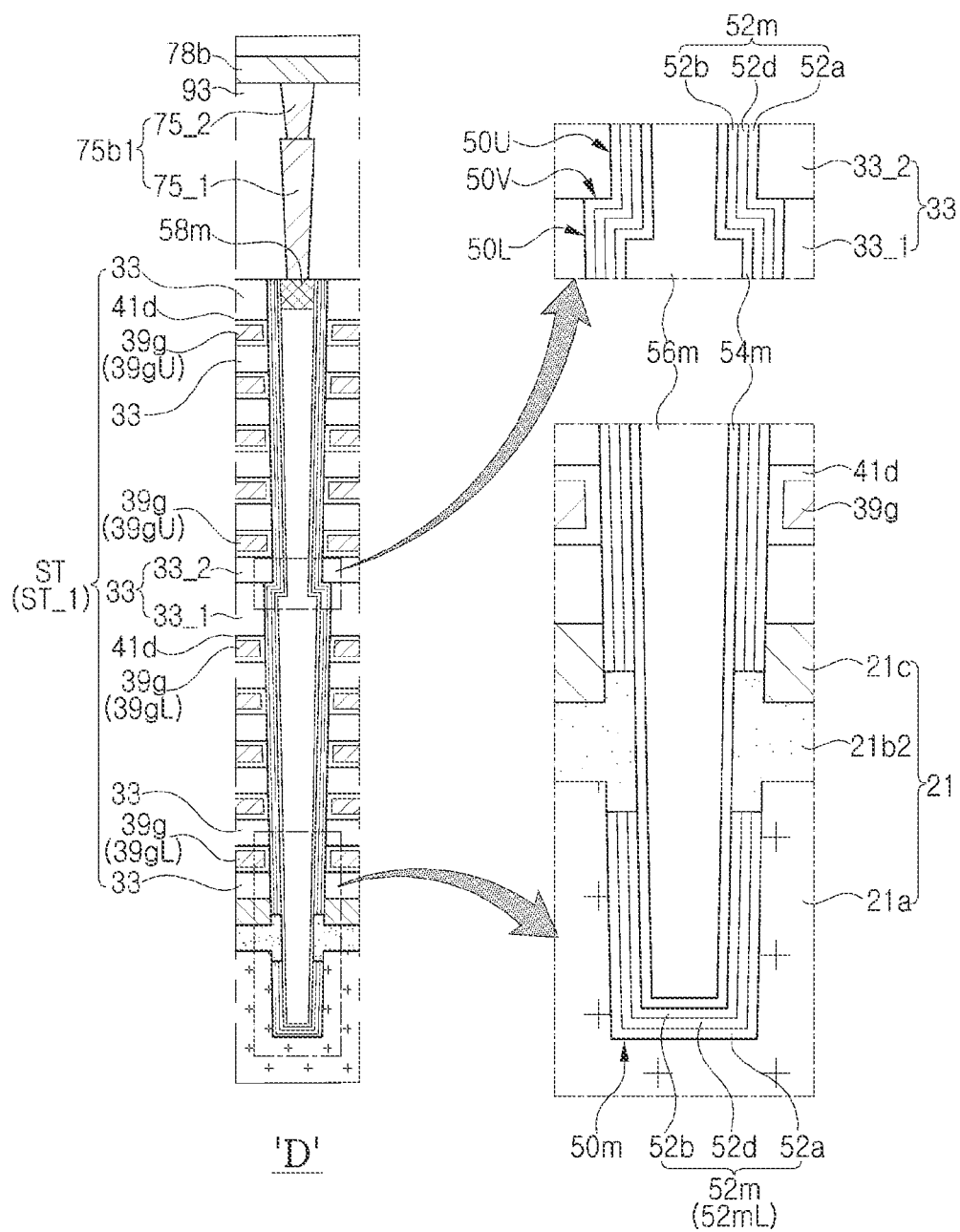

The string separation pattern 46, illustrated in FIG. 3B, may intersect and penetrate through a gate electrode, which may be an upper select gate electrode, among the plurality of upper gate electrodes (e.g., 39gU of FIG. 5A). The dummy vertical structures 50d may be in the buffer region BA and the dummy region DA, may penetrate through the string separation pattern 46 in the memory cell array region MCA, and may be below the first source connection line 78s1.

Next, the vertical memory structure 50m and the plate pattern 21 will mainly be described with reference to FIG. 5A. FIG. 5A is an enlarged cross-sectional view of region "D" of FIG. 4C.

Referring to FIG. 5A, a vertical memory structure 50m may include an insulating core region 56m, a pad pattern 58m on the insulating core region 56m, a dielectric structure 52m on a side surface of the insulating core region 56m and a side surface of the pad pattern 58m, and a channel layer 54m between the insulating core region 56m and the dielectric structure 52m and between the insulating core region 56m and the pad pattern 58m.

The pad pattern 58m may be at a higher level than an uppermost gate electrode, among the gate electrodes 39g.

The pad pattern 58m may include doped silicon, for example, polysilicon having a first type conductivity (e.g., N-type conductivity). The channel layer 54m may be in contact with the pad pattern 58m. The channel layer 54m may be formed of silicon. The dielectric structure 52m may include a first dielectric layer 52a, a data storage layer 52d, and a second dielectric layer 52b. The data storage layer 52d may be interposed between the first dielectric layer 52a and the second dielectric layer 52b. The first dielectric layer 52a may include silicon oxide and/or a high-k dielectric material. The data storage layer 52d may include a material for storing data in a memory device, for example, silicon nitride for trapping charges. The second dielectric layer 52b may be a tunnel dielectric layer in contact with the channel layer 54m. The second dielectric layer 52b may be silicon oxide or silicon oxide doped with impurities.

The gate electrodes 33g may include a plurality of lower gate electrodes 33gL and a plurality of upper gate electrodes 33gU on the plurality of lower gate electrodes 33gT.

The vertical memory structure 50m may include a lower vertical portion 50L that may penetrate or extend through the plurality of lower gate electrodes 33gL, an upper vertical portion 50U that may penetrate or extend through the plurality of upper gate electrodes 33gU, and a width change portion 50V between the vertical portion 50L and the upper vertical portion 50U.

The width-variable portion 50V may be between an uppermost lower gate electrode among the plurality of lower gate electrodes 33gL, and a lowermost upper gate electrode among the plurality of upper gate electrodes 33gU.

The width change portion 50V may have a side surface extending from and/or bending between a side surface of the lower vertical portion 50L and a side surface of the upper vertical portion 50U. The width change portion 50V may have a side slope different from a side slope of the lower vertical portion 50L and a side slope of the upper vertical portion 50U. Accordingly, the width change portion 50V may be referred to as a slope change portion or a bent portion.

The interlayer insulating layer 33, which is between the uppermost lower gate electrode among the plurality of lower gate electrodes 33gL, and the lowermost upper gate electrode among the plurality of upper gate electrodes 33gU, may include a first layer 33_1 and a second layer 33_2 on the second layer 33_1.

In the plate pattern 21, the second intermediate layer 21b2 may penetrate or extend through the dielectric structure 52m to be in contact with the channel layer 54m. The dielectric structure 52m may be divided into an upper dielectric structure 52mU and a lower dielectric structure 52mL by the second intermediate layer 21b2.

The above-described molded insulating layers 36a (of FIG. 4A) may include lower molded insulating layers 36aL, having substantially the same height as the plurality of lower gate electrodes 33gL, and upper molded insulating layers 36aU having substantially the same height as the plurality of upper gate electrodes 33gU. The conductive layers 39c (of FIG. 4A) may include lower conductive layers 39cL, having substantially the same height as the plurality of lower gate electrodes 33gL, and upper conductive layers 39cU having substantially the same height as the plurality of upper gate electrodes 33gU.

In some embodiments, for example when the semiconductor device 1 is a flash memory device, at least one of the plurality of upper gate electrodes 39gU may be an upper erase control gate electrode used in an erase operation of the flash memory device, and at least one of the gate electrodes 39gL may be a lower erase control gate electrode used in an erase operation of the flash memory device. The number of erase control gates may be determined depending on the total number of stacked gate electrodes 39g. Among the gate electrodes 39g between the upper and lower erase control gate electrodes, a plurality of gate electrodes may be wordlines. Among the gate electrodes 39g, a gate electrode between the lower erase gate electrode and the wordlines may be a ground select gate electrode, and a gate electrode between the upper erase gate electrode and the wordlines may be a string select gate electrode.

Figure 5B:
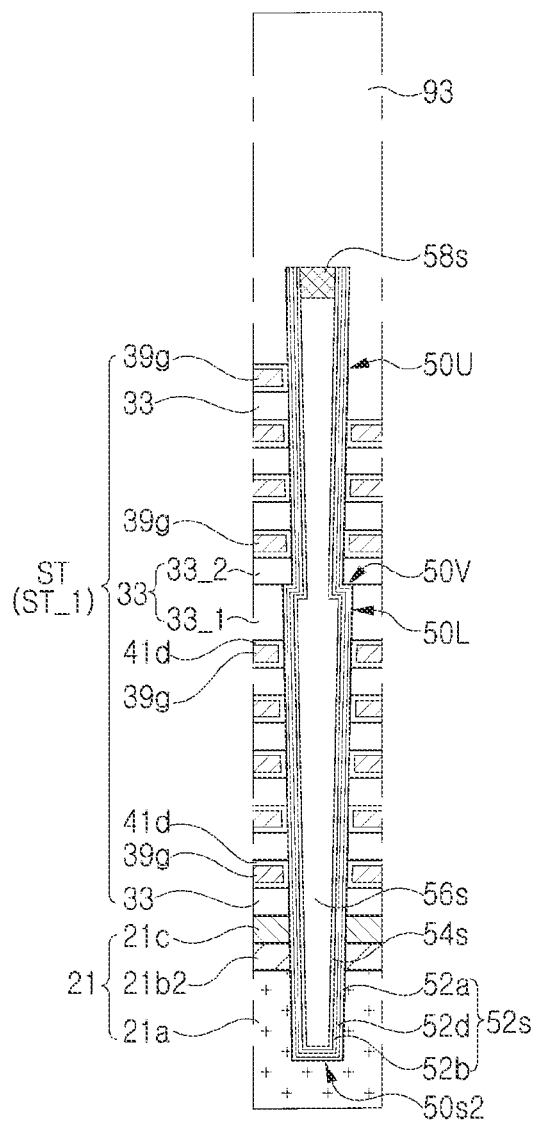

Next, the first and second vertical support structures 50s1 and 50s2, the vertical dummy structures 50d, and the plate pattern 21 will mainly be described with reference to FIG. 5B. FIG. 5B is an enlarged cross-sectional view of region "E" of FIG. 4C, and may represent a single second vertical support structure 50s2. The first and second vertical support structures 50s1 and 50s2 and the vertical dummy structures 50d may be formed of substantially the same layers and may have the same or similar cross-sectional structure.

Referring to FIG. 5B, the second vertical support structure 50s2 may include an insulating core region 56s, a pad pattern 58s on the insulating core region 56s, a dielectric structure 52s on a side surface of the insulating core region 56s and a side surface of the pad pattern 58s, and a channel layer 54s between the insulating core region 56s and the dielectric structure 52s and between the insulating core region 56s and the pad pattern 58s.

The insulating core region 56s, the pad pattern 58s, the dielectric structure 52s, and the channel layer 54s of the second vertical support structure 50s2 may correspond to the core region 56m, the pad pattern 58m, the dielectric structure 52m, and the channel layer 54m of the vertical memory structure 50m, respectively.

In the plate pattern 21, the first intermediate layer 21b1 may be in contact with the dielectric structure 52s and may be spaced apart from the channel layer 54s.

Hereinafter, among components of the semiconductor device 1 according to some example embodiments, some components which may be modified or replaced will mainly be described.

Figure 6:
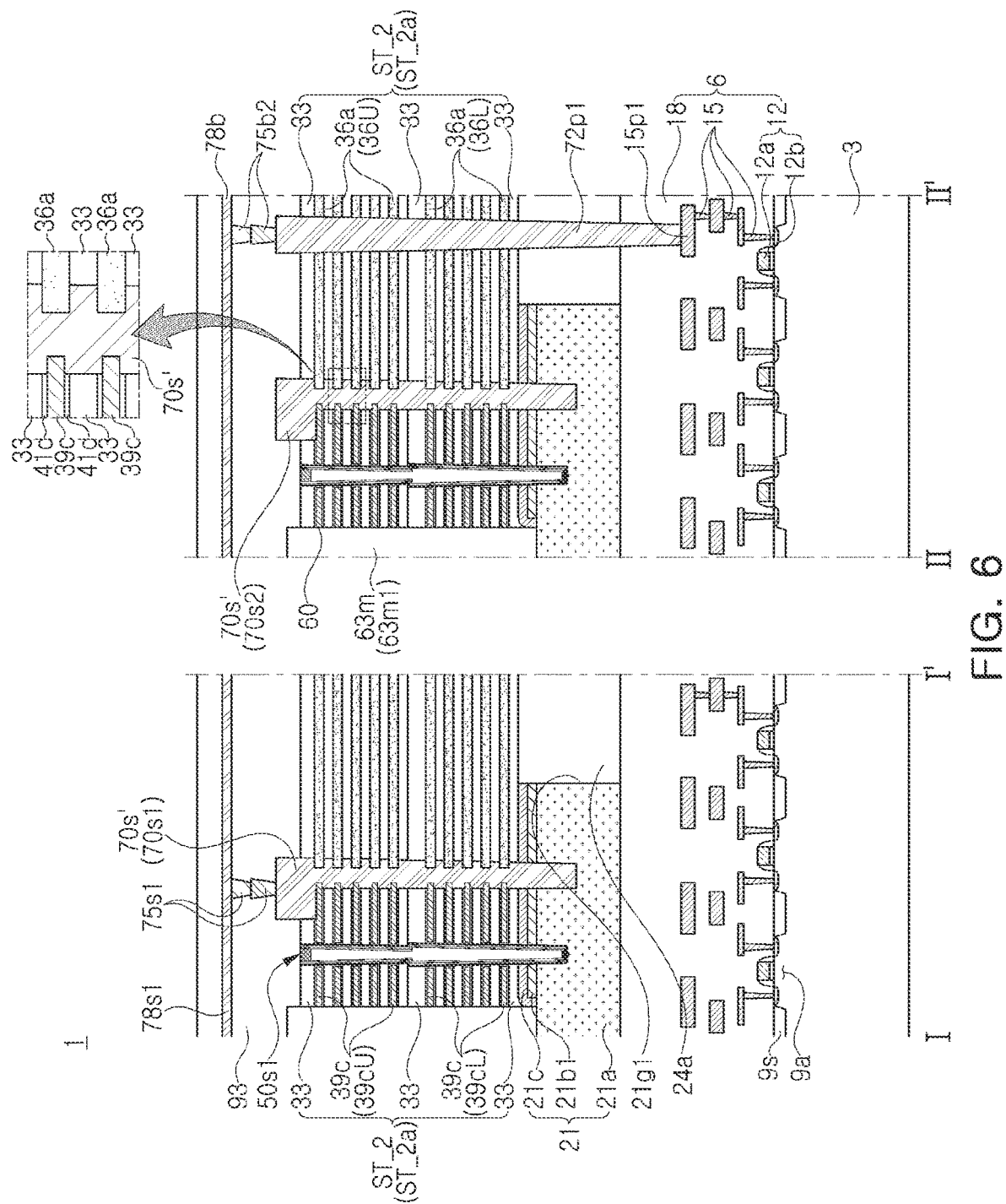
FIG. 6 is a cross-sectional view illustrating a modified example of a semiconductor device according to some example embodiments.

Next, a modified example of the cross-sectional structure of the source contact plugs 70s will be described with reference to FIG. 6. FIG. 6 is a cross-sectional view illustrating regions taken along lines I-I' and II-II' of FIG. 3A.

Referring to FIG. 6, the source contact plug 70s described of FIG. 4A may be replaced with a source contact plug 70s' in contact with an upper surface, a side surface, and a lower surface of each of the conductive layers 39c. The source contact plug 70s' may be in contact with an upper surface a side surface, and a lower surface of each of the molded insulating layers 36a.

Figure 7:
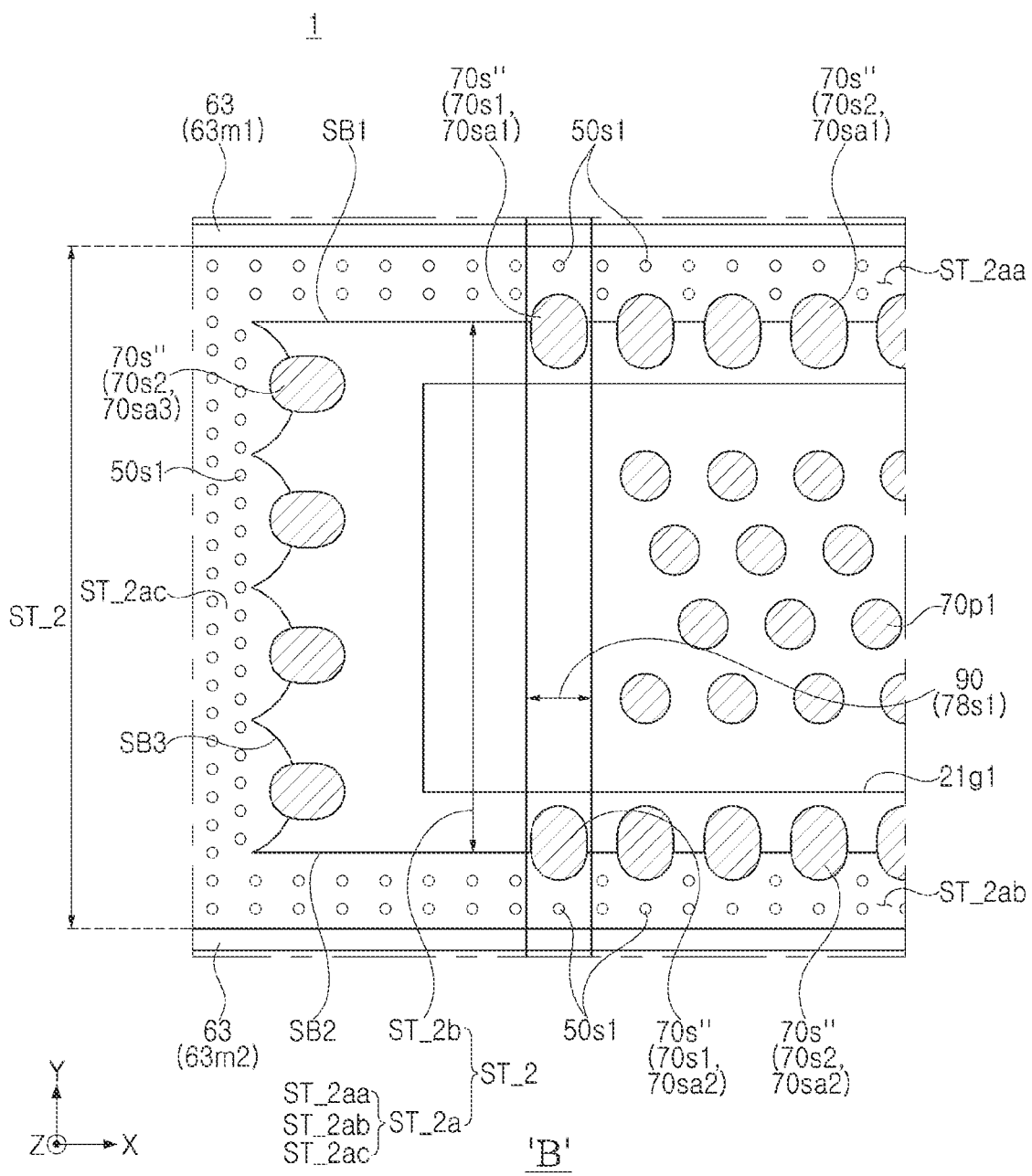
FIG. 7 is plan view illustrating a modified example of a semiconductor device according to some example embodiments.

Next, a modified example of the source contact plugs 70s in plan view will be described with reference to FIG. 7. FIG. 7 is plan view illustrating a modified example of the source contact plugs 70s in the plan view of FIG. 3A.

Referring to FIG. 7, in plan view, the source contact plugs 70s of FIG. 3A may be replaced with source contact plugs 70s''' elongated in one direction. For example, the source contact plugs 70s''' may include source contact plugs 70sa3' elongated in a first direction X and source contact plugs 70sa1' and 70sa2' elongated in a second direction Y.

Among the source contact plugs 70s''', source contact plugs having a shape elongated in the first direction X may be in contact with a third stacked portion ST_2ac, and source contact plugs elongated in the second direction Y may be in contact with first and second stacked portions ST_2aa and ST_2ab.

Figure 8:
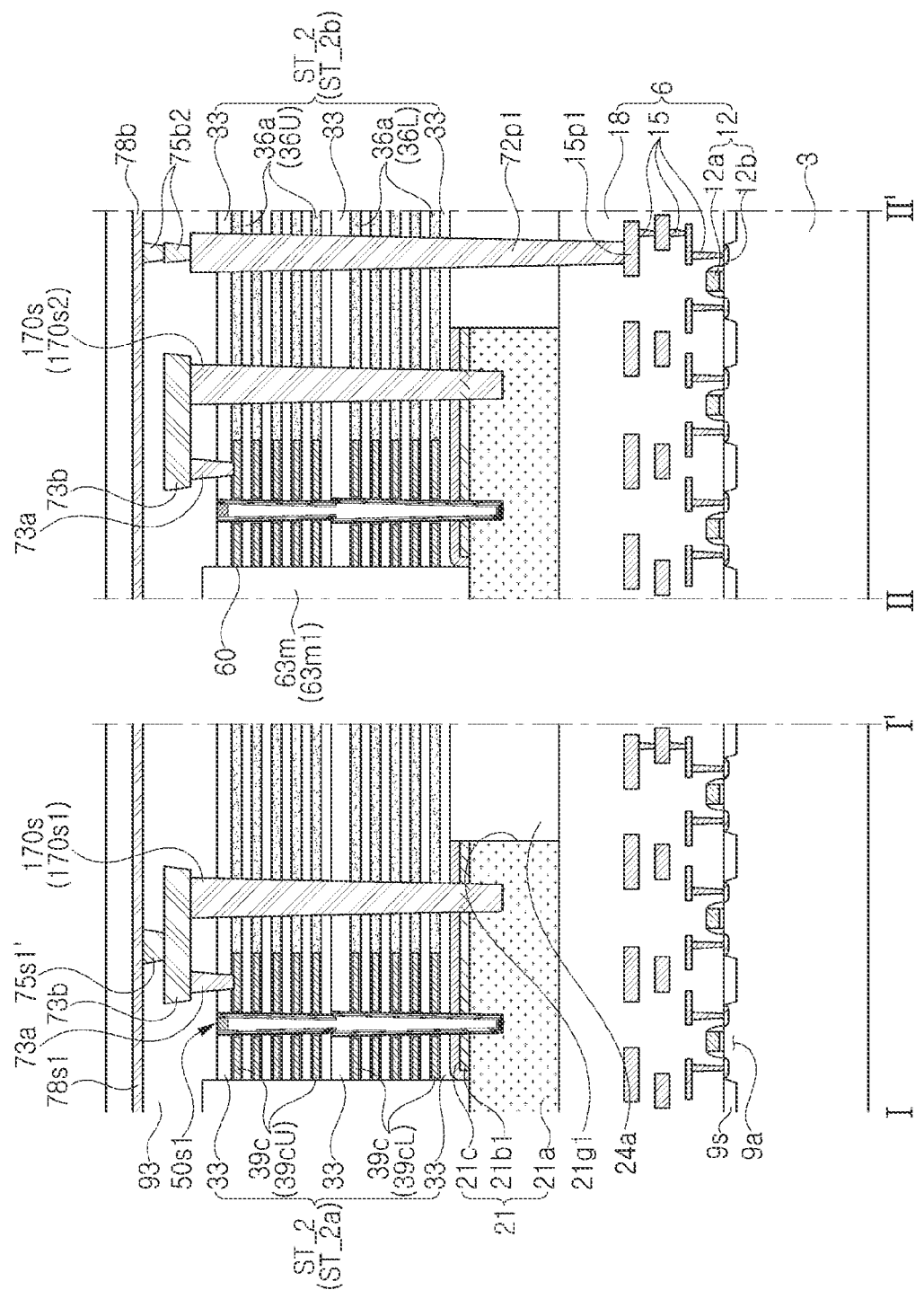
FIG. 8 is a cross-sectional view illustrating a modified example of a semiconductor device according to some example embodiments.

Next, a modified example of the source contact plugs 70s will be described with reference to FIG. 8. FIG. 8 may illustrate a modified example of the source contact plugs 70s and the source connection pattern 75s1 in the cross-sectional view of FIG. 4A illustrating regions taken along lines I-I' and II-II' of FIG. 3A.

Referring to FIG. 8, the source contact plugs 70s of FIG. 4A may be replaced with source contact plugs 170s that are spaced apart from the conductor stack region ST_2a and that penetrate or extend through the insulator stack region ST_2b to be in contact with the plate pattern 21. The semiconductor device 1 according to some example embodiments may further include connection structures 73a and 73b electrically connecting at least one of the conductive layers 39c and each of the source contact plugs 170s. The connection structures 73a and 73b may include first patterns 73a, arranged to be in contact with at least an uppermost conductive layer among the conductive layers 39c, and second patterns 73b electrically connecting the first patterns 73a and the source contact plugs 170s to each other.

The source contact plugs 170s may include a first source contact plug 170s1 overlapping the first source connection line 78s1, and second source contact plugs 170s2 that do not overlap the first source connection line 78s1.

The source connection pattern 75s1 described in FIG. 4A may be replaced with a source connection pattern 75s1' electrically connecting the second pattern 73b and the first source connection line 78s1 between the first source connection line 78s1 and the second pattern 73b electrically connected to the first source contact plug 170s.

Next, a modified example of the dummy separation structures 63d and the third boundary SB3 between the third stack portion ST_2ac and the insulator stack region ST_2b, described with reference to FIG. 3A, in plan view will be described with reference to FIG. 9.

Figure 9:
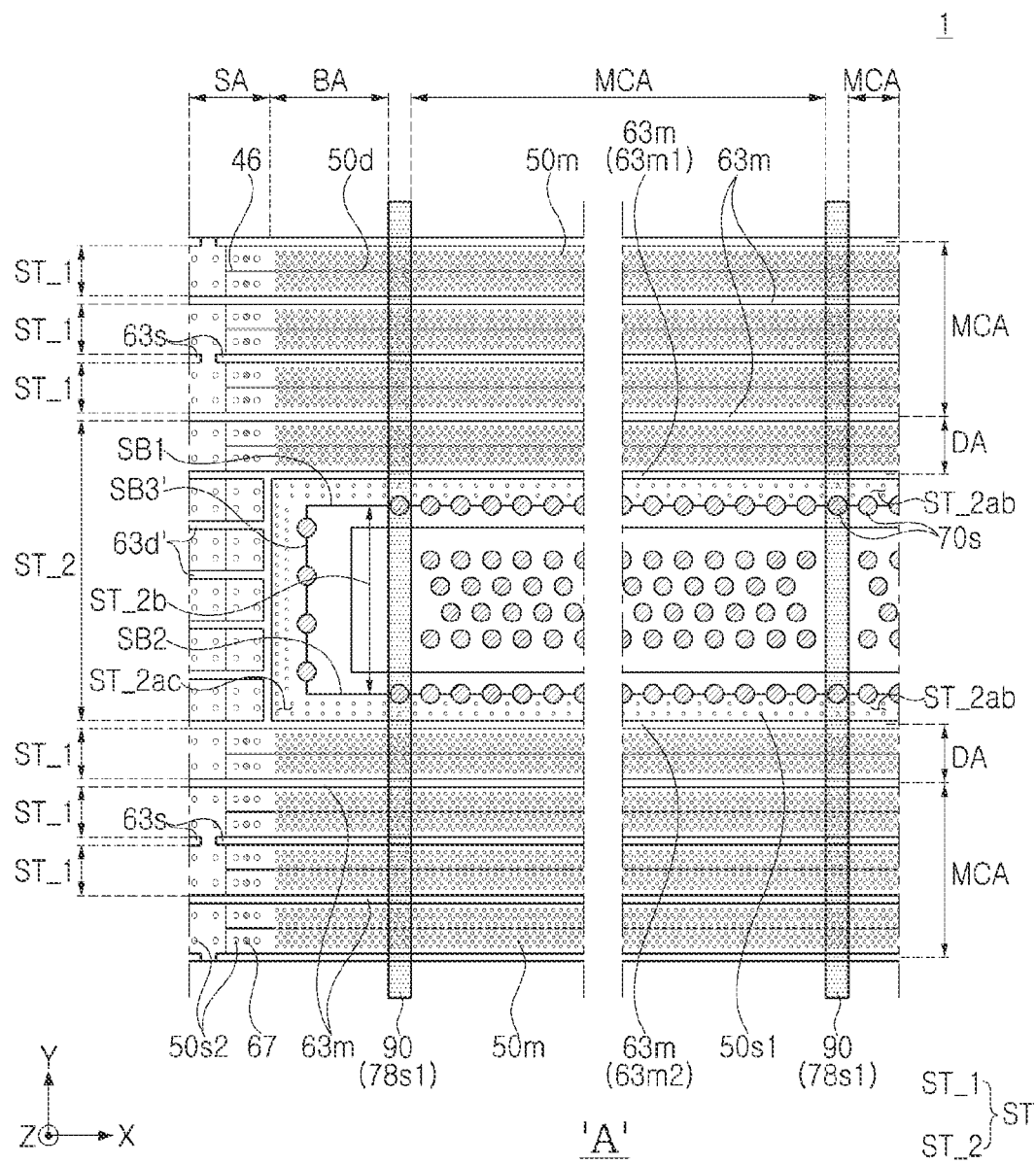
FIG. 9 is plan view illustrating a modified example of a semiconductor device according to some example embodiments.

Referring to FIG. 9, in the plan view, the third boundary SB3 between the third stack portion ST_2ac and the insulator stack region ST_2b of FIG. 3A may be replaced with a third boundary SB3' having a linear shape and extending in the second direction. The dummy separation structures 63d of FIG. 3A may be replaced with dummy separation structures 63d' including a first line portion, extending in the second direction Y between the first and second main separation structures 63m1 and 63m2, and second line portions disposed in a direction away from the insulator stack region ST_2b from the first line portion.

Figure 10:
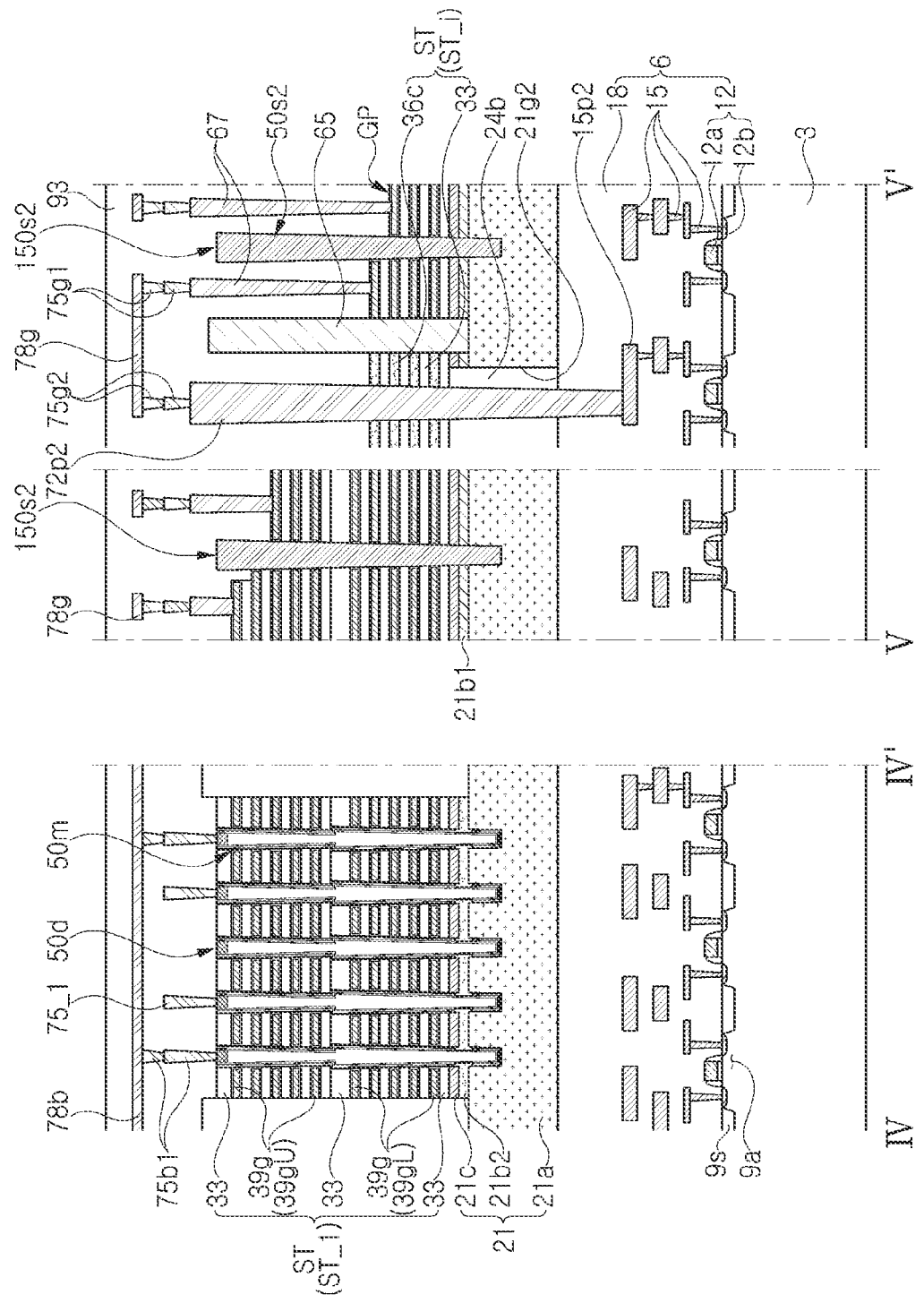
FIG. 10 is a cross-sectional view illustrating a modified example of a semiconductor device according to some example embodiments.

Next, a modified example of the second vertical support structures 50s2 of FIG. 4C will be described with reference to FIG. 10. FIG. 10 may illustrate a modified example of the second vertical support structures 50s2 in the cross-sectional view of FIG. 4C illustrating regions taken along line IV-IV' of FIG. 3B and line V-V of FIG. 1.

Referring to FIG. 10, the second vertical support structures 50s2 be modified into second vertical support structures 150s2 having a structure different from the structure of the first vertical support structures 50s1 and the structure of the vertical dummy structures 50d. For example, the first vertical support structures 50s1 and the vertical dummy structures 50d may be formed to include the insulating core region 56s, the pad pattern 58s, and the dielectric structure 52s, and the channel layer 54s as in FIG. 5B, and the second vertical support structures 50s2 may not include the pad pattern 58s, the dielectric structure 52s, and the channel layer 54s. The second vertical support structures 50s2 may be formed of pillars formed of silicon oxide.

Figure 11:
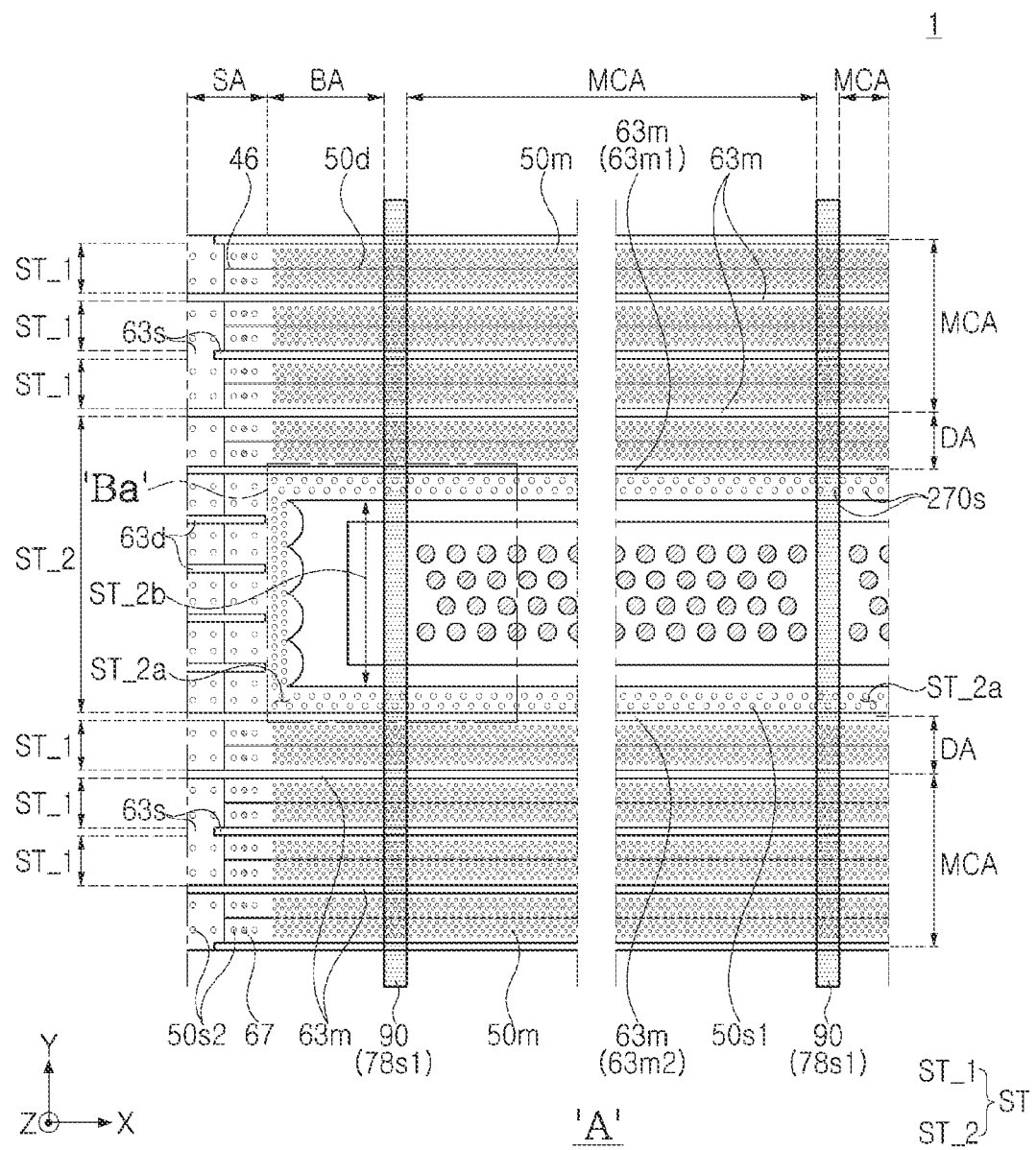
FIGS. 11 to 13 are diagrams illustrating a modified example of a semiconductor device according to some example embodiments.

Next, a modified example of the source contact plugs 70s will be described with reference to FIGS. 11 to 13. FIG. 11 is an enlarged plan view of region "A" of FIG. 1, FIG. 12 is an enlarged plan view of region "Ba'" of FIG. 11, and FIG. 13 is a cross-sectional view illustrating regions taken along line Ia-Ia' and IIa-IIa' of FIG. 12.

Figure 12:
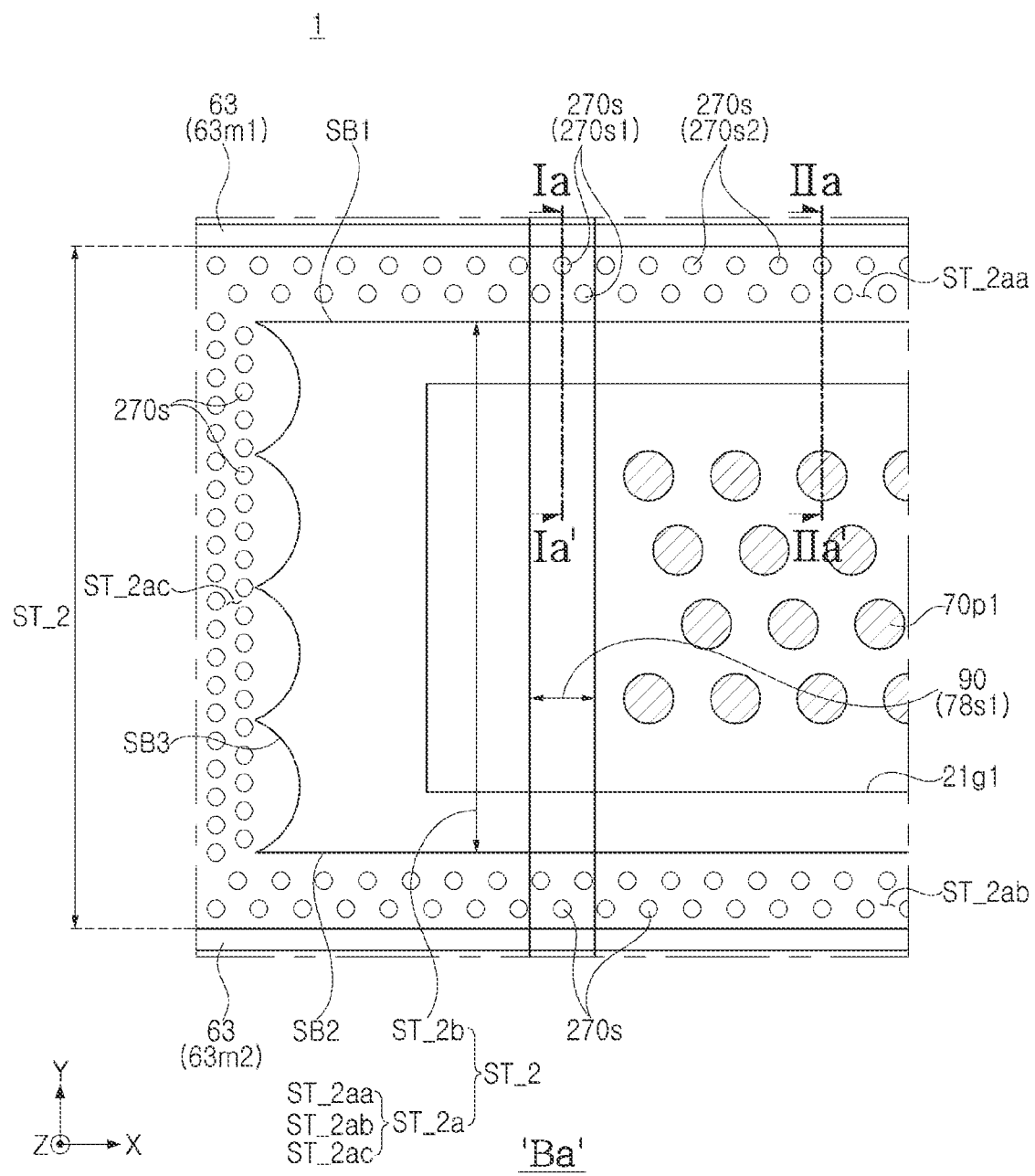
Figure 13:
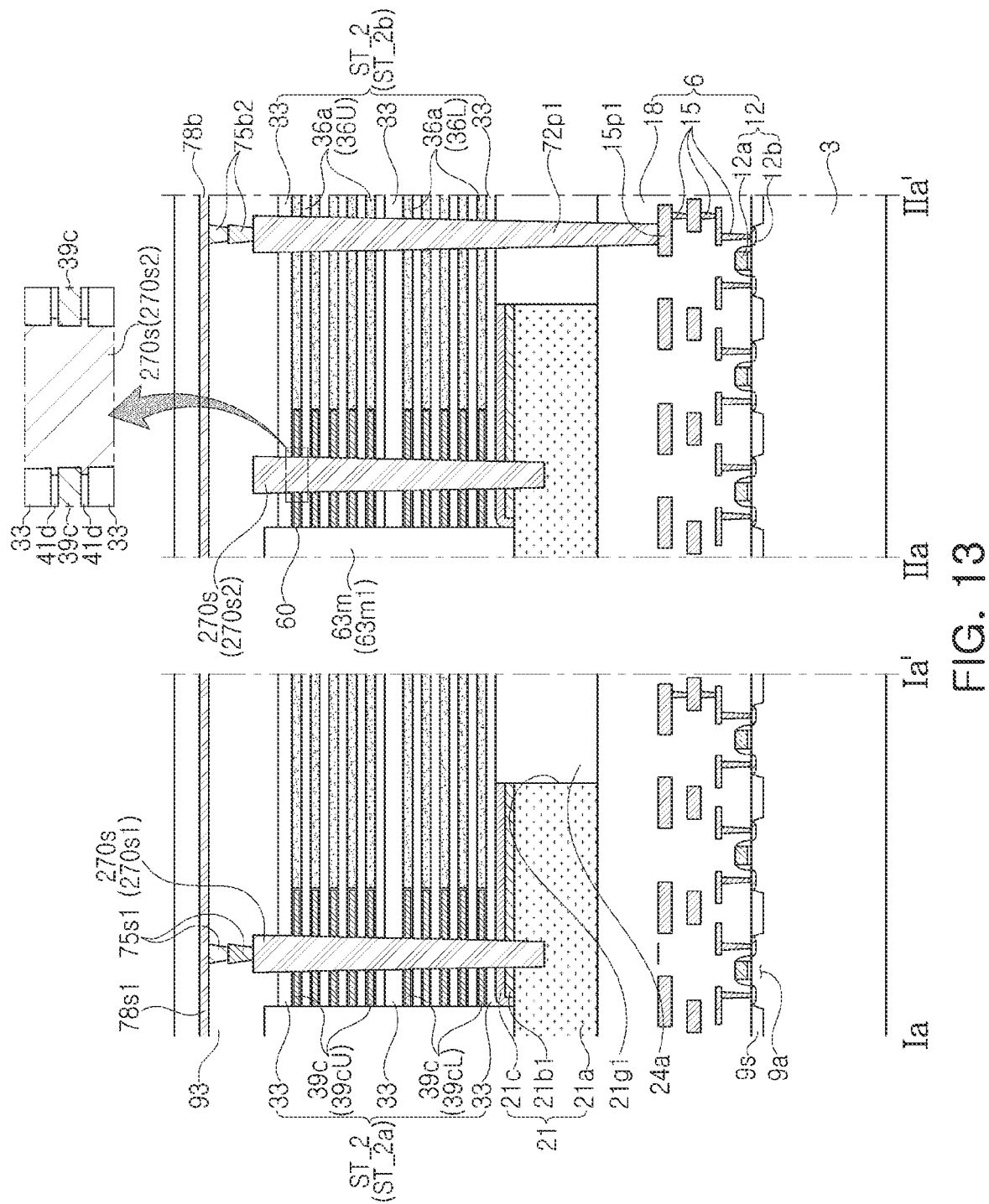

Referring to FIGS. 11 to 13, in FIGS. 2, 3A and 4A, the first vertical support structures 50s1 penetrating through the conductor stack region ST_2a may be omitted, and the source contact plugs 70s may be replaced with source contact plugs 270s that penetrate or extend through the conductor stack region ST_2a and are arranged to be in contact with the plate pattern 21. The source contact plugs 270s may be spaced apart from the insulator stack region ST_2b.

The source contact plugs 270s may be in contact with the conductive layers 39c.

The source contact plugs 270s may be in contact with a side surface, an upper surface, and a lower surface of each of the conductive layers 39c. The source contact plugs 270s may include a first source contact plug 270s1 overlapping the first source connection line 78s1, and second source contact plugs 270s2 that are not overlapping the first source connection line 78s1.

The source contact plugs 270s may include first side source contact plugs penetrating or extending through the first stack portion ST_2aa, second side source contact plugs penetrating or extending through the second stack portion ST_2ab, and the third side source contact plugs penetrating or extending through the stack portion ST_2ac. The first source connection line 78s1 may overlap at least one of the first side source contact plugs, and may overlap at least one of the second side source contact plugs.

Figure 14:
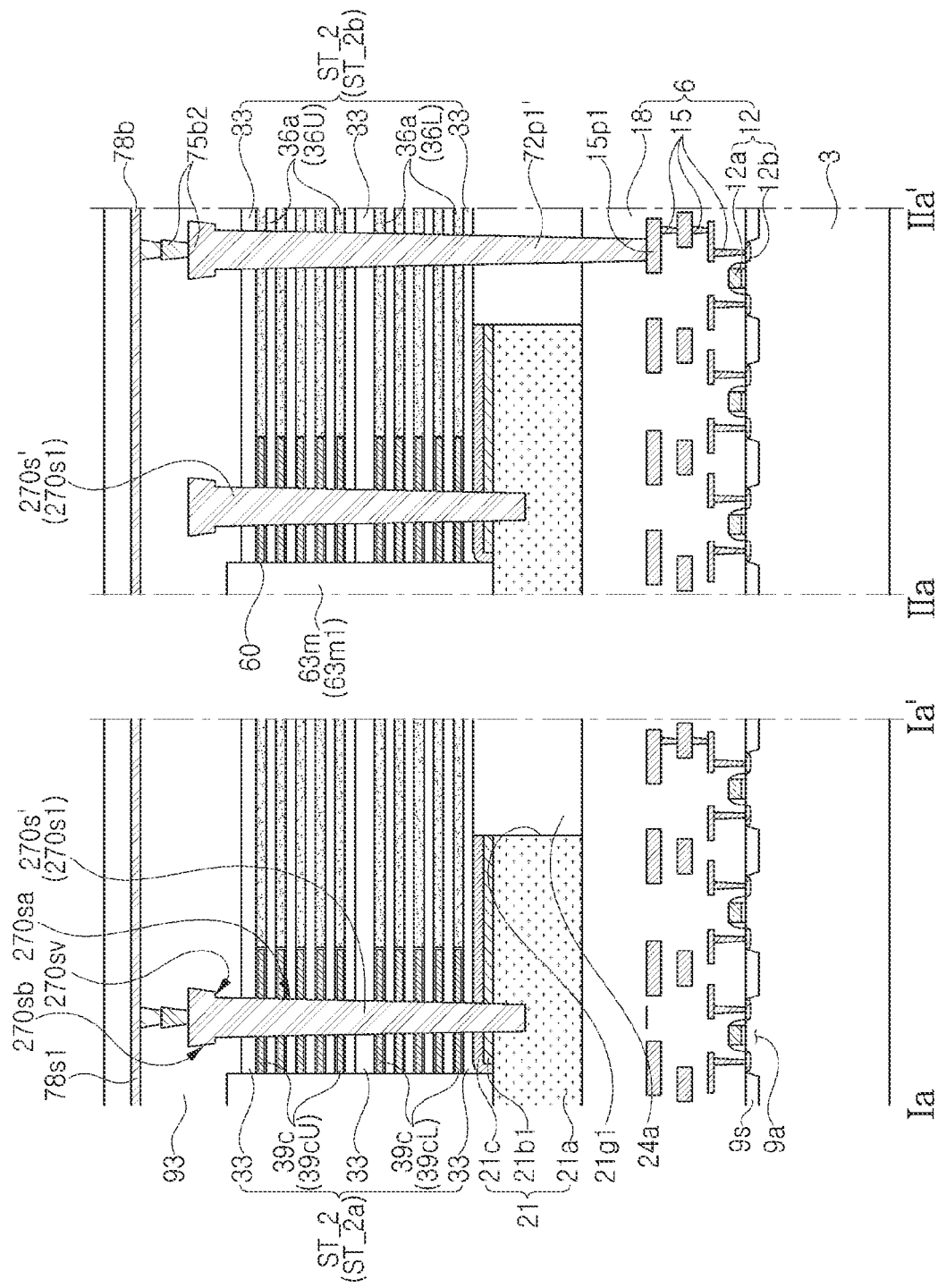
FIG. 14 is a cross-sectional view illustrating a modified example of a semiconductor device according to some example embodiments.

Next, a modified example of the source contact plugs 270s of FIG. 13 will be described with reference to FIG. 14. FIG. 14 is a cross-sectional view illustrating regions taken along lines Ia-Ia' and IIa-IIa' of FIG. 12.

Referring to FIG. 14, the source contact plugs 270s of FIG. 13 may be modified into source contact plugs 270s' including a width change portion 270sv having a width changed on a higher level than the stack structure ST. For example, the source contact plugs 270s' may include a first portion 270sa, a second portion 270sb having a greater width than the first portion 270sa on the first portion 270sa, and the width change portion 270sv formed due to a difference in width between the first portion 270sa and the second portion 270sb. The second portion 270sb may be at a higher level than the stack structure ST.

The above-described first peripheral contact plug 72p1 may be modified into a first peripheral contact plug 72p1' having the same shape as the source contact plugs 270s' on a higher level than the stack structure ST.

Figure 15:
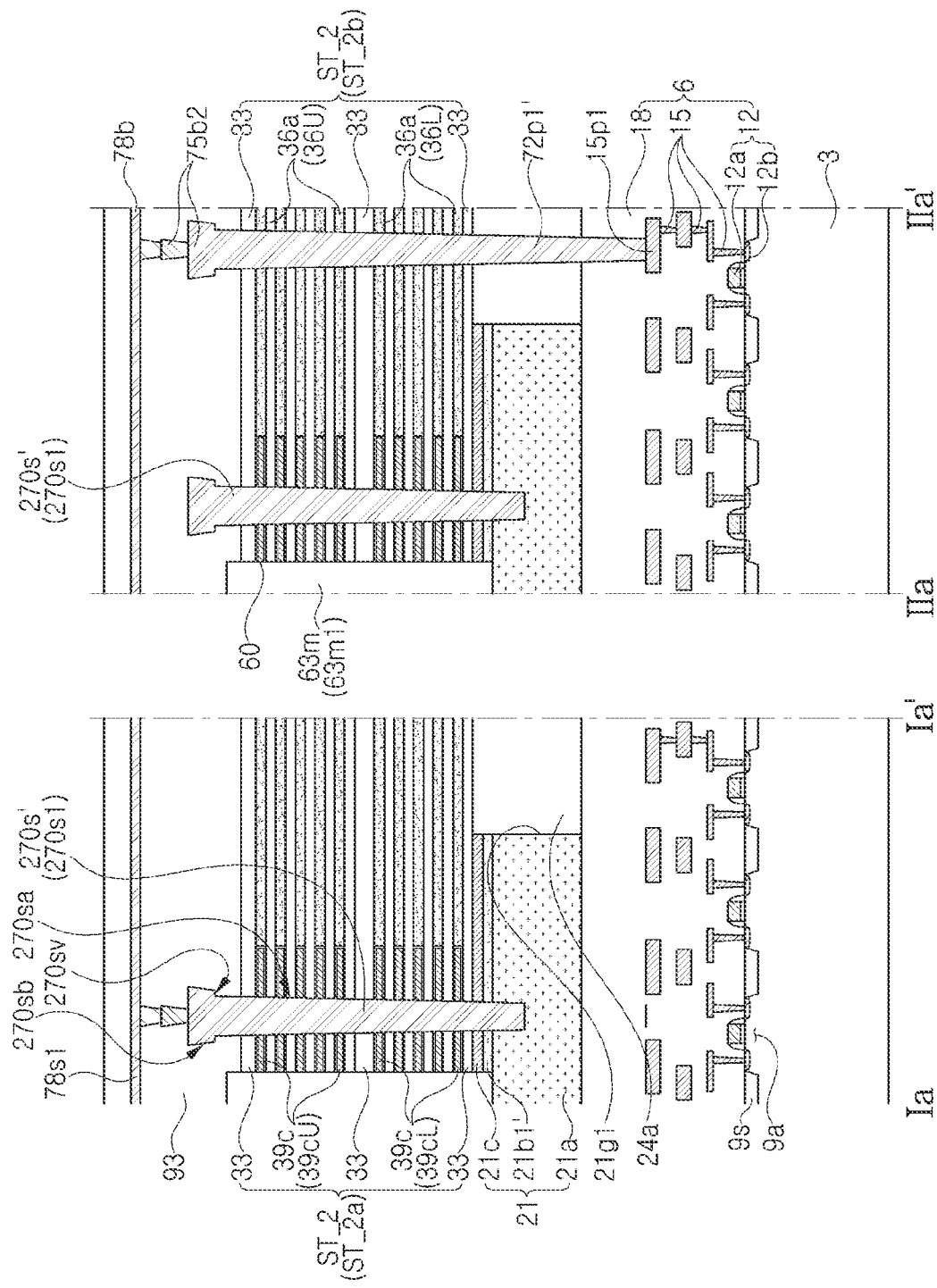
FIG. 15 is a cross-sectional view illustrating a modified example of a semiconductor device according to some example embodiments.

Next, a modified example of the first intermediate layer 21b1 of the plate pattern 21 will be described with reference to FIG. 15. FIG. 15 is a cross-sectional view illustrating regions taken along lines Ia-Ia' and IIa-IIa' of FIG. 12.

Referring to FIG. 15, the first intermediate layer (21b1 of FIGS. 4A, 6, 8, and 13) of the above-described plate pattern 21 may be in contact with the main separation structure 63m, and may be modified into a first intermediate layer 21b1' including doped polysilicon.

Next, a modified example of the third boundary SB3' between the third stack portion ST_2ac and the insulator stack region ST_2b in FIG. 12 and the dummy separation structures 63d in FIG. 11 in plan view will be described with reference to FIG. 16.

Figure 16:
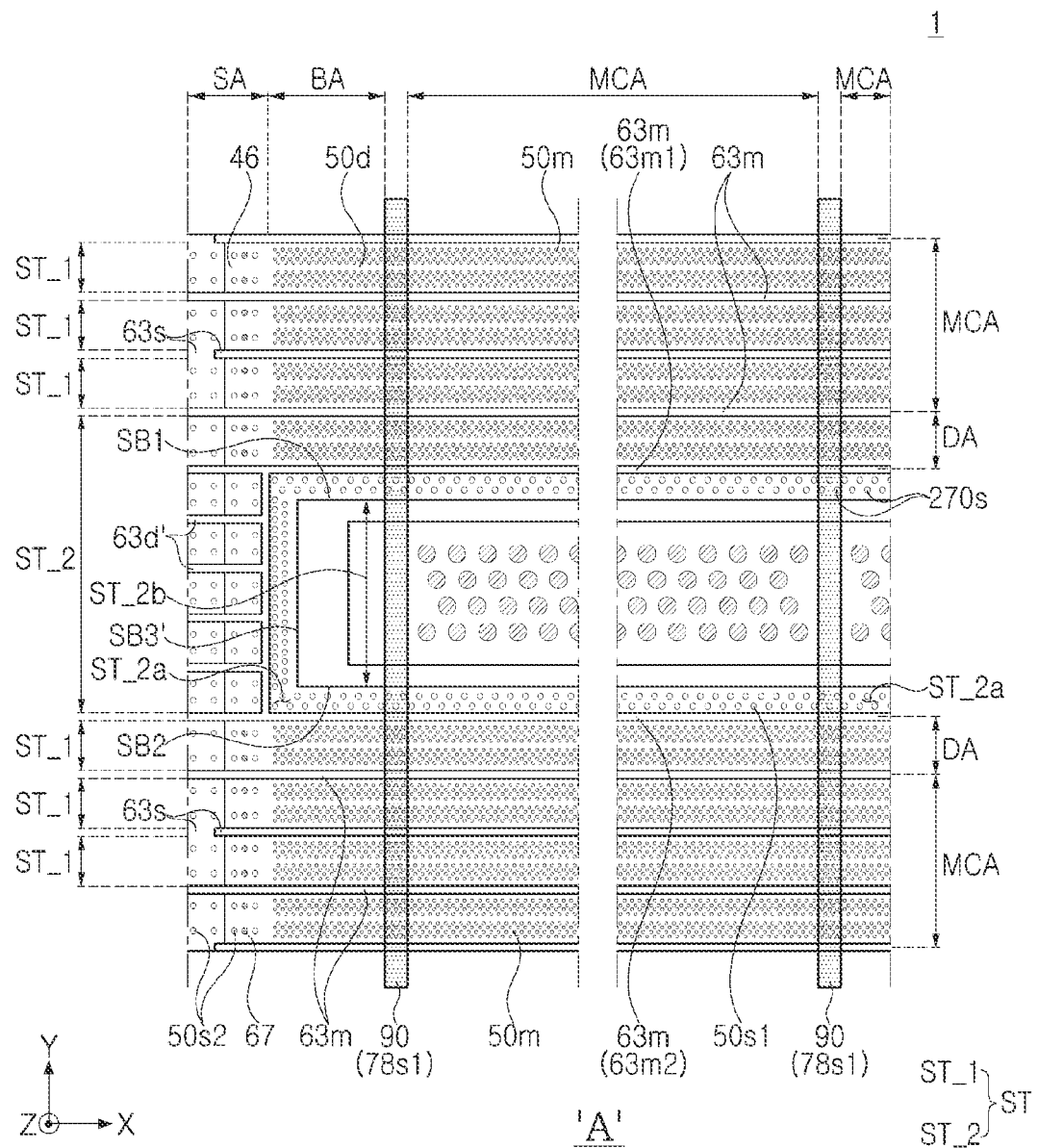
FIG. 16 is plan view illustrating a modified example of a semiconductor device according to some example embodiments.

Referring to FIG. 16, in the plan view, the third boundary SB3' between the third stack portion ST_2ac and the insulator stack region ST_2b of FIG. 12 may be modified into a third boundary SB3' in the form of a line extending in the second direction Y as in FIG. 9. The dummy separation structures 63d of FIG. 11 may be modified into dummy separation structures 63d' including a first line portion, extending in the second direction Y between the first and second main separation structures 63m1 and 63m2 as in FIG. 9, and dummy separation structures 63d' arranged in a direction away from the insulator stacking region ST_2b from the first line portion.

Figure 17:
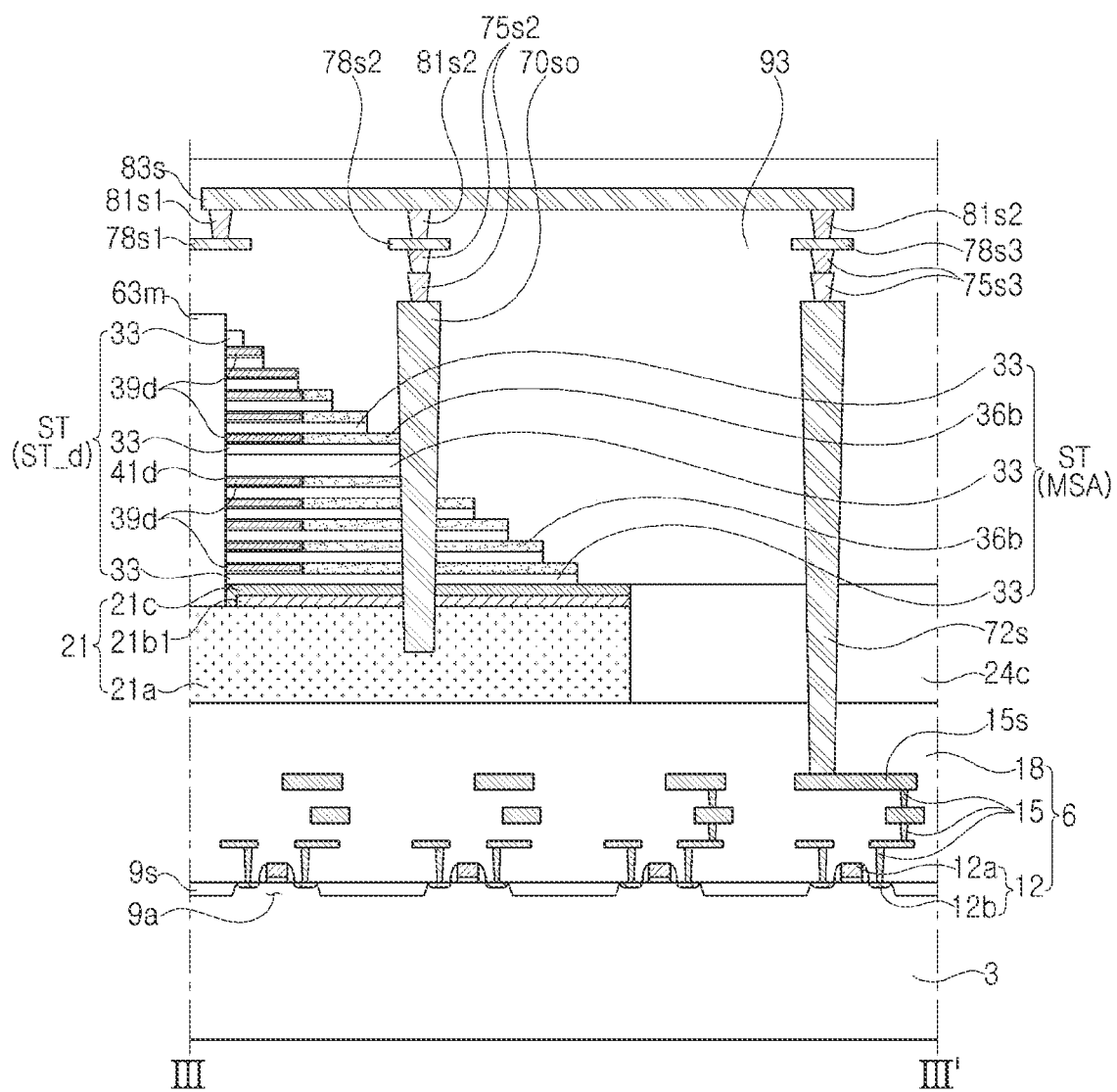
FIG. 17 is a cross-sectional view illustrating a modified example of a semiconductor device according to some example embodiments.

Next, a modified example of the first and second interconnection structures 84 and 88 described with reference to FIG. 4B will be described with reference to FIG. 17. FIG. 17 is a cross-sectional view illustrating regions taken along line of FIG. 1.

Referring to FIG. 17, the first upper connecting line 83s1 described with reference to FIG. 4B may be modified into an upper connection line 83s extending to an upper portion of the third peripheral contact plug 72s. The upper connection line 83s may be electrically connected to the third peripheral contact plug 72s through a plurality of plugs 75s3, 78s3, and 81s2 between the upper connection line 83s and the third peripheral contact plug 72s.

Figure 18:
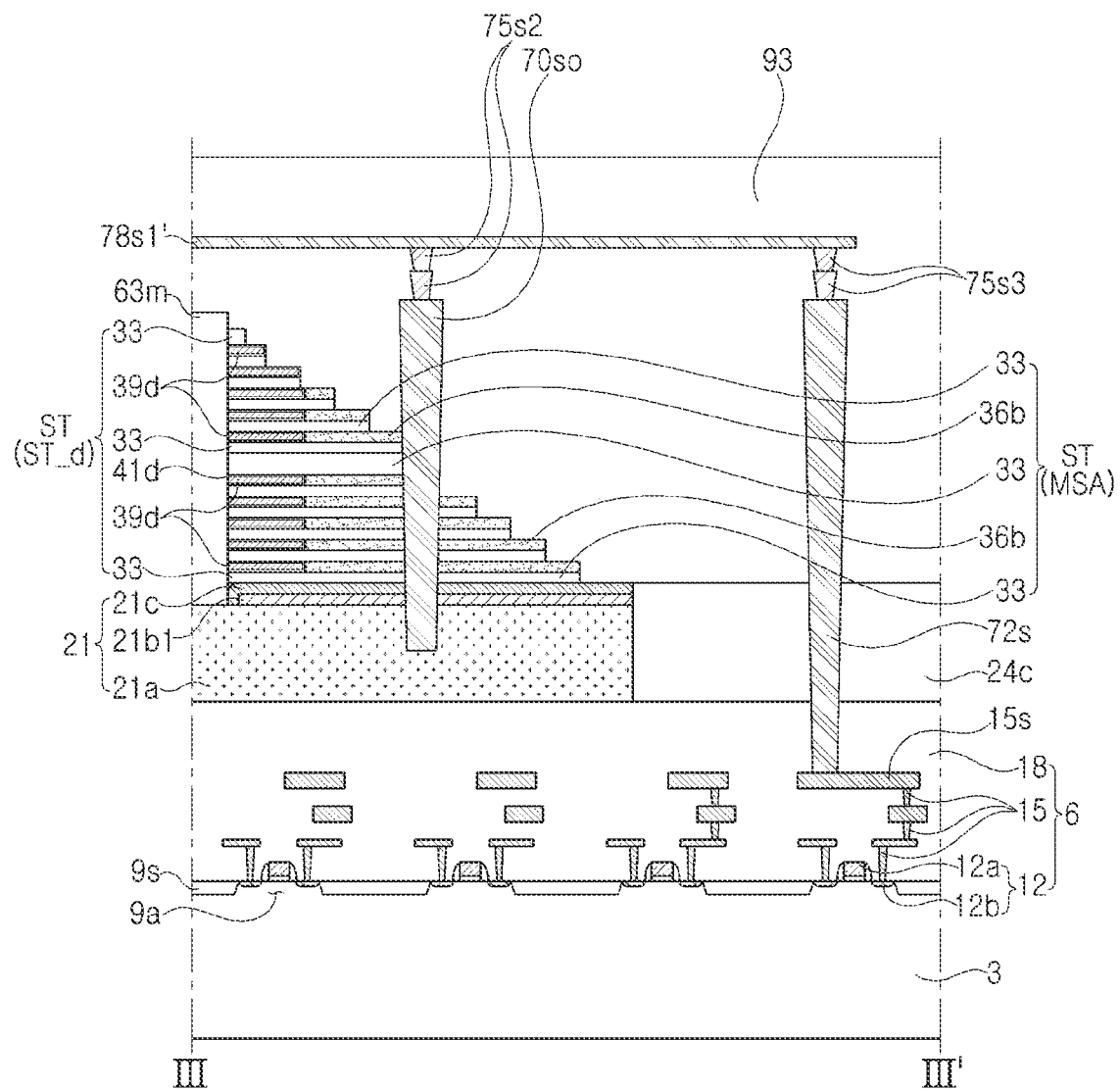
FIG. 18 is a cross-sectional view illustrating a modified example of a semiconductor device according to some example embodiments.

Next, a modified example of the first and second interconnection structures 84 and 88 described with reference to FIG. 4B will be described with reference to FIG. 18. FIG. 18 is a cross-sectional view illustrating regions taken along line of FIG. 1.

Referring to FIG. 18, the first source connection line 78s1 of FIG. 4B may be modified into a source connection line 78s1' extending to upper portions of the external source contact plugs 70s0 and to an upper portion of the third peripheral contact plug 72s. The source connecting line 78s1' may be electrically connected to the external source contact plugs 70so through the plugs 75s2 between the source connecting line 78s1' and the external source contact plugs 70so, and may be electrically connected to the third peripheral contact plugs 72s through a plug 75s3 that is between the third peripheral contact plugs 72s and the source connecting line 78s1'.

Figure 19:
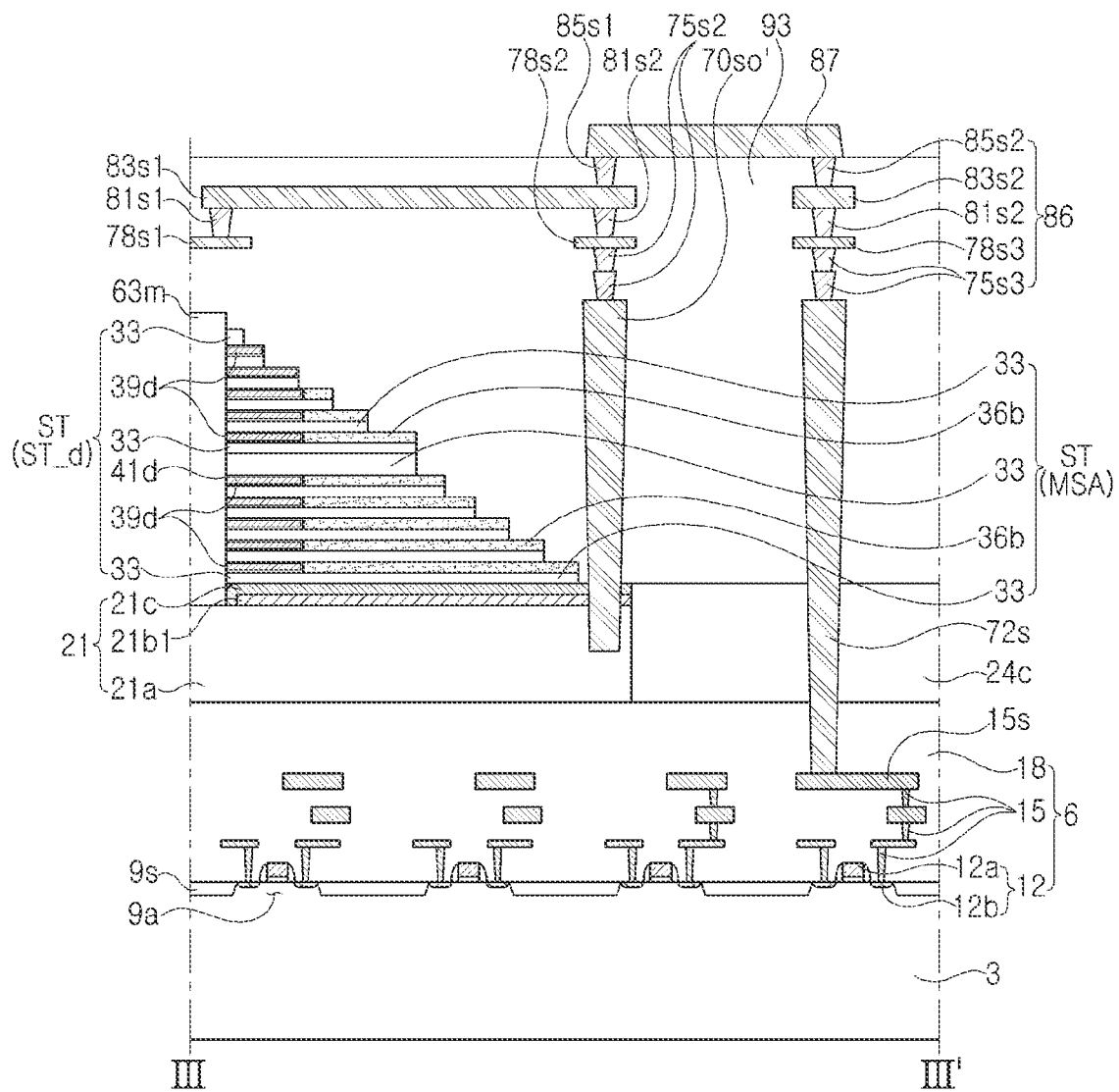
FIG. 19 is a cross-sectional view illustrating a modified example of a semiconductor device according to some example embodiments.

Next, a modified example of the external source contact plugs 70so described with reference to FIG. 4B will be described with reference to FIG. 19. FIG. 19 is a cross-sectional view illustrating a modified example of the external source contact plugs 70so of FIG. 4B.

Referring to FIG. 19, in FIG. 4B, the external source contact plugs 70so that penetrate or extend through the mold staircase region MSA of the stack structure ST to be in contact with the plate pattern 21 may be modified into external source contact plugs 70so' spaced apart from the stack structure ST and in contact with the plate pattern 21.

Figure 20:
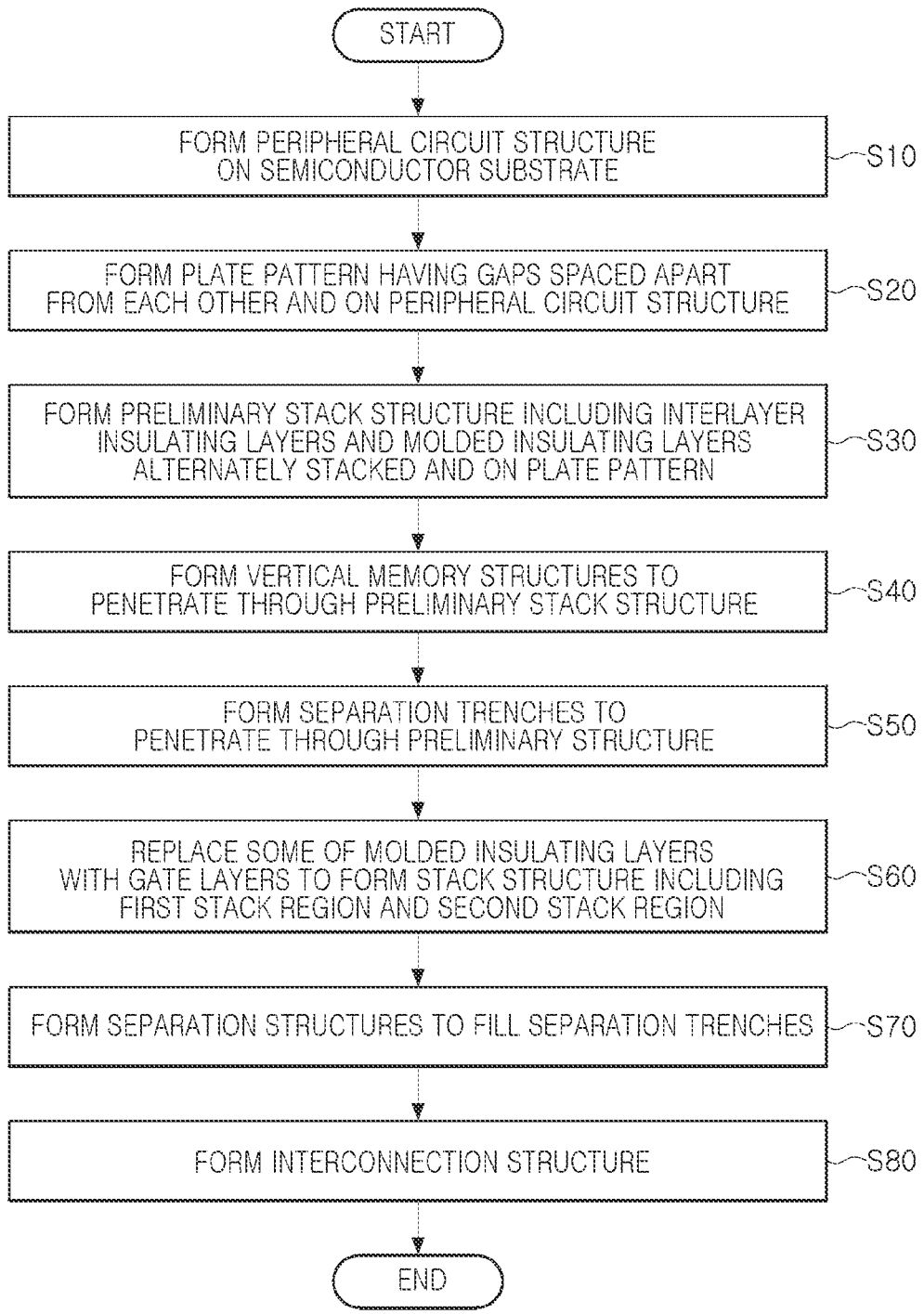
FIG. 20 is a process flowchart illustrating an example of a method of forming a semiconductor device according to some example embodiments.

An example of a method of forming a semiconductor device according to some example embodiments will be described with reference to FIG. 20. FIG. 20 is a process flowchart illustrating an example of a method of forming a semiconductor device according to some example embodiments.

Referring to FIG. 20, in operation S10, a peripheral circuit structure (e.g., 6 of FIGS. 4A to 4C) may be formed on a semiconductor substrate (e.g., 3 of FIGS. 4A to 4C). In operation S20, a plate pattern (e.g., 21 of FIGS. 4A and 4B), having gaps (e.g., 21g1 and 21g2 of FIGS. 4A and 4B) spaced apart from each other, may be formed on the peripheral circuit structure. Intermediate gap-fill patterns (e.g., 24a and 24b of FIGS. 4A to 4C) within the gaps of the plate pattern 21 and an intermediate insulating layer (e.g., 24c of FIGS. 4A to 4C) on the external side surface of the plate pattern 21 may be simultaneously formed or formed in a common operation.

In operation S30, a preliminary stack structure including interlayer insulating layers 33 and molded insulating layers alternately stacked on the plate pattern 21 may be formed. In operation S40, vertical memory structures penetrating through the preliminary stack structure may be formed. While forming the vertical memory structures, vertical support structures (e.g., 50s1 of FIG. 4A, 50s2 of FIG. 4C, and 50s2 of FIG. 5B) and vertical dummy structures (e.g., 50d of FIG. 4C) may be simultaneously formed or formed in a common operation.

In operation S40, separation trenches (e.g., 60 of FIG. 4A) penetrating through the preliminary stack structure may be formed.

In some embodiments, a portion of the plate pattern 21 may be replaced with a polysilicon material layer to form a second intermediate layer 21b2 as illustrated in FIGS. 4C and 5A. In some embodiments, the second intermediate layer (e.g., 21b2 of FIGS. 4C and 5A) may penetrate through the dielectric structure (e.g., 52m of FIGS. 4C and 5A) of the vertical memory structures (e.g., 50m of FIGS. 4C and 5A) to be in contact with the channel layer (e.g., 54m of FIGS. 4C and 5A).

In operation S60, some of the molded insulating layers may be replaced with gate layers to form a stack structure (e.g., ST of FIGS. 1 to 5B) including a first stack region (e.g., ST_1 of FIGS. 1 to 5B) and a second stack region (e.g., ST_2 of FIGS. 1 to 5B) ST of 5b).

The gate layers may include gate electrodes 39g and 39d and the conductive layers 39c as described with reference to FIGS. 1 to 5B. The gate layers may further include the dielectric layer 41d as described with reference to FIGS. 1 to 5B. Among the molded insulating layers, remaining molded insulating layers may be the molded insulating layers 36a, 36b, and 36c as described with reference to FIGS. 4A to 4C.

In operation S70, separation structures (e.g., 60m, 60s, and 60d of FIGS. 1 to 4C) may be formed to fill the isolation trenches (e.g., 60 of FIG. 4A).

In operation S80, an interconnection structure may be formed. The interconnection structure may be conductive patterns for electrically connecting the plate pattern 21, the vertical memory structures 50m, and the gate electrodes 39g to the peripheral circuit 12 of the peripheral circuit structure 6. Such an interconnection structure may include various components as described with reference to FIGS. 1 to 19, for example, the source contact plugs (e.g., 70 of FIG. 4A), the external source contact plugs (e.g., 70so of FIG. 4B), the gate contact plug (e.g., 67 of FIG. 4C), the first to third peripheral contact plugs (e.g., 72p1, 72p2, 72s of FIGS. 4A to 4C), the bitline (e.g., 78b of FIGS. 4A and 4C), the gate connection line (e.g., 78g of FIG. 4C), and the interconnection structure (e.g., 84 and 88 of FIGS. 1 to 4C).

Next, a data storage system including a semiconductor device according to some example embodiments will be described with reference to each of FIGS. 21, 22, and 23.

Figure 21:
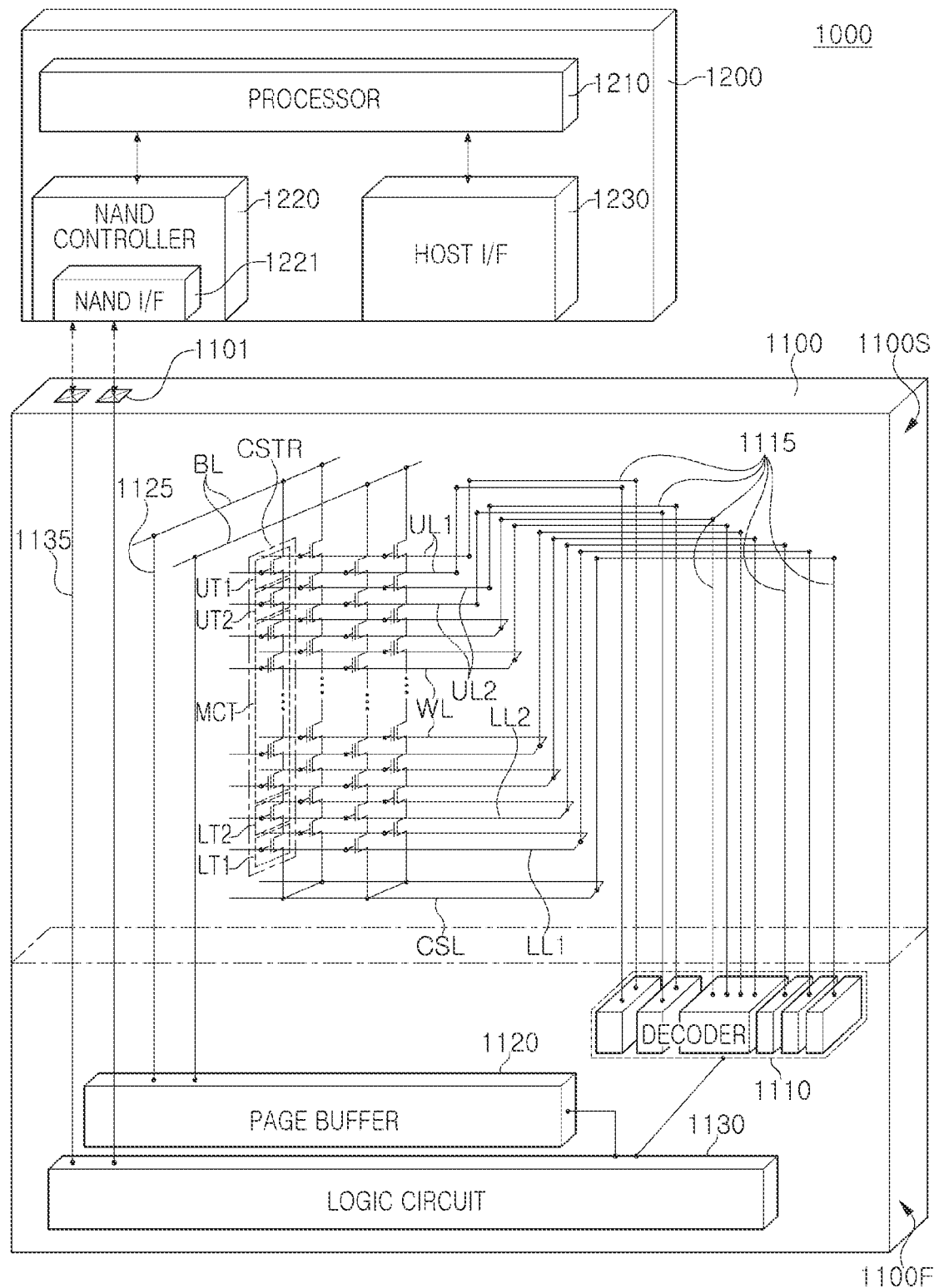
FIG. 21 is a schematic diagram illustrating a data storage system including a semiconductor device according to some example embodiments.

FIG. 21 is a schematic diagram illustrating a data storage system including a semiconductor device according to some example embodiments.

Referring to FIG. 21, a data storage system 1000 in some example embodiments may include a semiconductor device 1100 and a controller 1200 electrically connected to the semiconductor device 1100 to control the semiconductor device 1100. The data storage system 1000 may be implemented by a storage device including the semiconductor device 1100 or an electronic device including a storage device. For example, the data storage system 1000 may be implemented by a solid-state drive device (SSD), a universal serial bus (USB), a computing system, a medical device, or a communication device, including the semiconductor device 1100.

In some example embodiments, the data storage system 1000 may be implemented by an electronic system storing data.

The semiconductor device 1100 may be implemented by a semiconductor device described in the above-described example embodiments with reference to FIGS. 1 to 19. The semiconductor device 1100 may include a first structure 1100F and a second structure 1100S on the first structure 1100F.

The first structure 1100F may be a peripheral circuit structure including a decoder circuit 1110, a page buffer 1120, and a logic circuit 1130. For example, the first structure 1100F may include the peripheral circuit structure (6 of FIGS. 4A to 4C) including the above-described peripheral circuit (12 of FIGS. 4A to 4C). The peripheral circuit (12 of FIGS. 4A to 4C) may be a transistor constituting a peripheral circuit structure including the decoder circuit 1110, the page buffer 1120, and the logic circuit 1130.

The second structure 1100S may be a memory structure including a bitline BL, a common source line CSL, wordlines WL, first and second gate upper lines UL1 and UL2, first and second gate lower lines LL1 and LL2, and memory cell strings CSTR between the bitline BL and the common source line CSL.

In the second structure 1100S, each of the memory cell strings CSTR may include lower transistors LT1 and LT2 adjacent to the common source line CSL, upper transistors UT1 and UT2 adjacent to the bitline BL, and a plurality of memory cell transistors MCT between the lower transistors LT1 and LT2 and the upper transistors UT1 and UT2. The number of the lower transistors LT1 and LT2 and the number of the upper transistors UT1 and UT2 may vary in example embodiments.

In some example embodiments, the upper transistors UT1 and UT2 may include a string select transistor, and the lower transistors LT1 and LT2 may include a ground select transistor. The lower gate lines LL1 and LL2 may be gate electrodes of lower transistors LT1 and LT2, respectively. The wordlines WL may be gate electrodes of memory cell transistors MCT, and the gate upper lines UL1 and UL2 may be gate electrodes of the upper transistors UT1 and UT2, respectively.

The above-described gate horizontal layers (39G of FIGS. 4C and 5A) may constitute the lower gate lines LL1 and LL2, the wordlines WL, and the upper gate lines UL1 and UL2.

In some example embodiments, the lower transistors LT1 and LT2 may include a lower erase control transistor LT1 and a ground select transistor LT2 connected to each other in series. The upper transistors UT1 and UT2 may include a string select transistor UT1 and an upper erase control transistor UT2 connected to each other in series. At least one of the lower erase control transistor LT1 and the upper erase control transistor UT1 may be used for an erase operation to erase data, stored in the memory cell transistors MCT, using a gate-induced drain leakage (GIDL) phenomenon.

The common source line CSL, the first and second gate lower lines LL1 and LL2, word lines WL, and the first and second gate upper lines UL1 and UL2 may be electrically connected to the decoder circuit 1110 through first connection lines 1115 extending from the first structure 1100F to the second structure 1100S.

At least a portion of the above-described plate pattern (21 of FIGS. 4A to 4C) may be the common source line CSL. The bitlines BL may be electrically connected to the page buffer 1120 through second connection lines 1125 extending from the first structure 1100F to the second structure 1100S. The bitlines BL may be the above-described bitlines 78b.

In the first structure 1100F, the decoder circuit 1110 and the page buffer 1120 may perform a control operation on at least one select memory cell transistor of the plurality of memory cell transistors MCT. The decoder circuit 1110 and the page buffer 1120 may be controlled by a logic circuit 1130.

The semiconductor device 1000 may further include an input/output pad 1101.

The semiconductor device 1100 may communicate with the controller 1200 through the input and output pad 1101 electrically connected to the logic circuit 1130. The input/output pad 1101 may be electrically connected to the logic circuit 1130 through an input/output connection line 1135 extending from the first structure 1100F to the second structure 1100S. Accordingly, the controller 1200 may be electrically connected to the semiconductor device 1000 through the input/output pad 1101 and may control the semiconductor device 10000.

The controller 1200 may include a processor 1210, a NAND controller 1220, and a host interface 1230. According to some example embodiments, the data storage system 1000 may include a plurality of semiconductor devices 1100. In this case, the controller 1200 may control the plurality of semiconductor devices 1000.

The processor 1210 may control overall operation of the data storage system 1000 including the controller 1200. The processor 1210 may operate according to a predetermined firmware and may control the NAND controller 1220 to access the semiconductor device 1100. The NAND controller 1220 may include a NAND interface 1221 for processing communication with the semiconductor device 1100. A control command for controlling the semiconductor device 1100, data to be written in the memory cell transistors MCT of the semiconductor device 1100, and/or data to be read from the memory cell transistors MCT of the semiconductor device 1100 may be transmitted through the NAND interface 1221. The host interface 1230 may provide a communication function between the data storage system 1000 and an external host. When a control command is received from an external host through the host interface 1230, the processor 1210 may control the semiconductor device 1100 in response to the control command.

Figure 22:
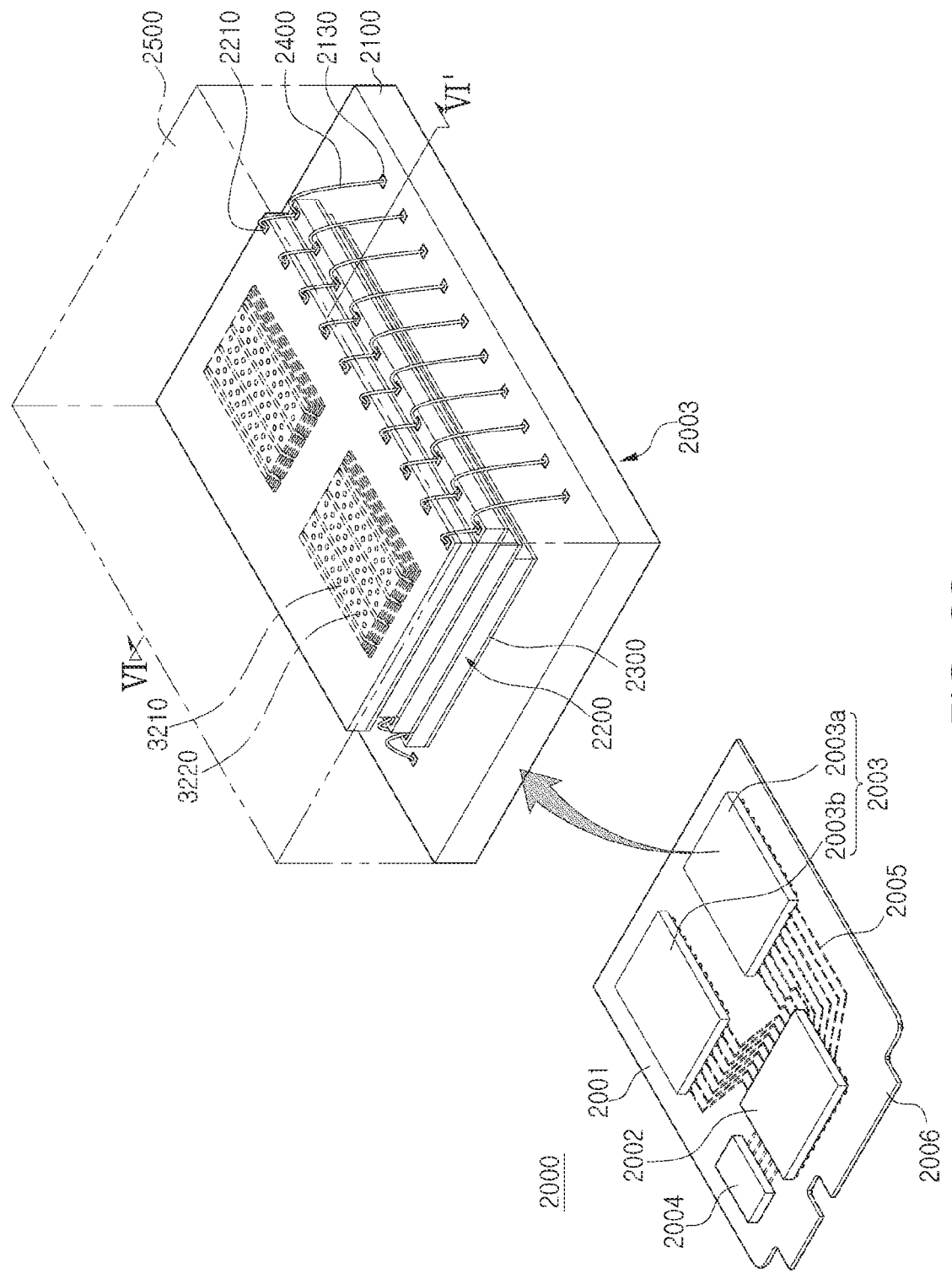
FIG. 22 is a schematic perspective view illustrating a data storage system including a semiconductor device according to some example embodiments.

FIG. 22 is a schematic perspective view illustrating a data storage system including a semiconductor device according to some example embodiments.

Referring to FIG. 22, a data storage system 2000 in some example embodiments may include a main substrate 2001, a controller 2002 mounted on the main substrate 2001, one or more semiconductor packages 2003, and a DRAM 2004. The semiconductor package 2003 and the DRAM 2004 may be connected to the controller 2002 by interconnection patterns 2005 formed on the main substrate 2001.

The main substrate 2001 may include a connector 2006 including a plurality of pins coupled to an external host. The number and arrangement of the plurality of pins in the connector 2006 may be varied according to a communication interface between the data storage system 2000 and the external host. In some example embodiments, the data storage system 2000 may communicate with an external host according to one of interfaces such as a universal serial bus (USB), peripheral component interconnect express (PCI-Express), serial advanced technology attachment (SATA), and M-PHY for universal flash storage (UFS). In some example embodiments, the data storage system 2000 may operate by power supplied from an external host through the connector 2006. The data storage system 2000 may further include a power management integrated circuit (PMIC) for distributing power supplied from the external host to the controller 2002 and the semiconductor package 2003.

The controller 2002 may write data in the semiconductor package 2003 or may read data from the semiconductor package 2003 and may improve an operation speed of the data storage system 2000.

The DRAM 2004 may be implemented by a buffer memory for reducing a difference in speed between the semiconductor package 2003, a data storage space, and an external host. The DRAM 2004 included in the data storage system 2000 may also operate as a type of cache memory and may provide a space for temporarily storing data in a control operation performed on the semiconductor package 2003. When the DRAM 2004 is included in the data storage system 2000, the controller 2002 may further include a DRAM controller for controlling the DRAM 2004 in addition to the NAND controller for controlling the semiconductor package 2003.

The semiconductor package 2003 may include first and second semiconductor packages 2003a and 2003b spaced apart from each other. Each of the first and second semiconductor packages 2003a and 2003b may be configured as a semiconductor package including a plurality of semiconductor chips 2200. Each of the semiconductor chips 2200 may include a semiconductor device, such as the example embodiments described above with reference to FIGS. 1 to 19.

Each of the first and second semiconductor packages 2003a and 2003b may include a package substrate 2100, semiconductor chips 2200 on the package substrate 2100, adhesive layers 2300 on a lower surface of each of the semiconductor chips 2200, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be implemented by a printed circuit board including package upper pads 2130. Each of the semiconductor chips 2200 may include an input/output pad 2210.

In some example embodiments, the connection structure 2400 may be configured as a bonding wire electrically connecting the input and output pad 2210 to the package upper pads 2130. Accordingly, in each of the first and second semiconductor packages 2003a and 2003b, the semiconductor chips 2200 may be electrically connected to each other by a bonding wire method and may be electrically connected to the package upper pads 2130 of the package substrate 2100. In some example embodiments, in each of the first and second semiconductor packages 2003a and 2003b, the semiconductor chips 2200 may be electrically connected to each other by a connection structure including a through-silicon via (TSV), instead of the connection structure 2400 of a bonding wire method.

In some example embodiments, the controller 2002 and the semiconductor chips 2200 may be included in a single package. For example, the controller 2002 and the semiconductor chips 2200 may be mounted on an interposer substrate different from the main substrate 2001, and the controller 2002 may be connected to the semiconductor chips 2200 through an interconnection formed on the interposer substrate.

Figure 23:
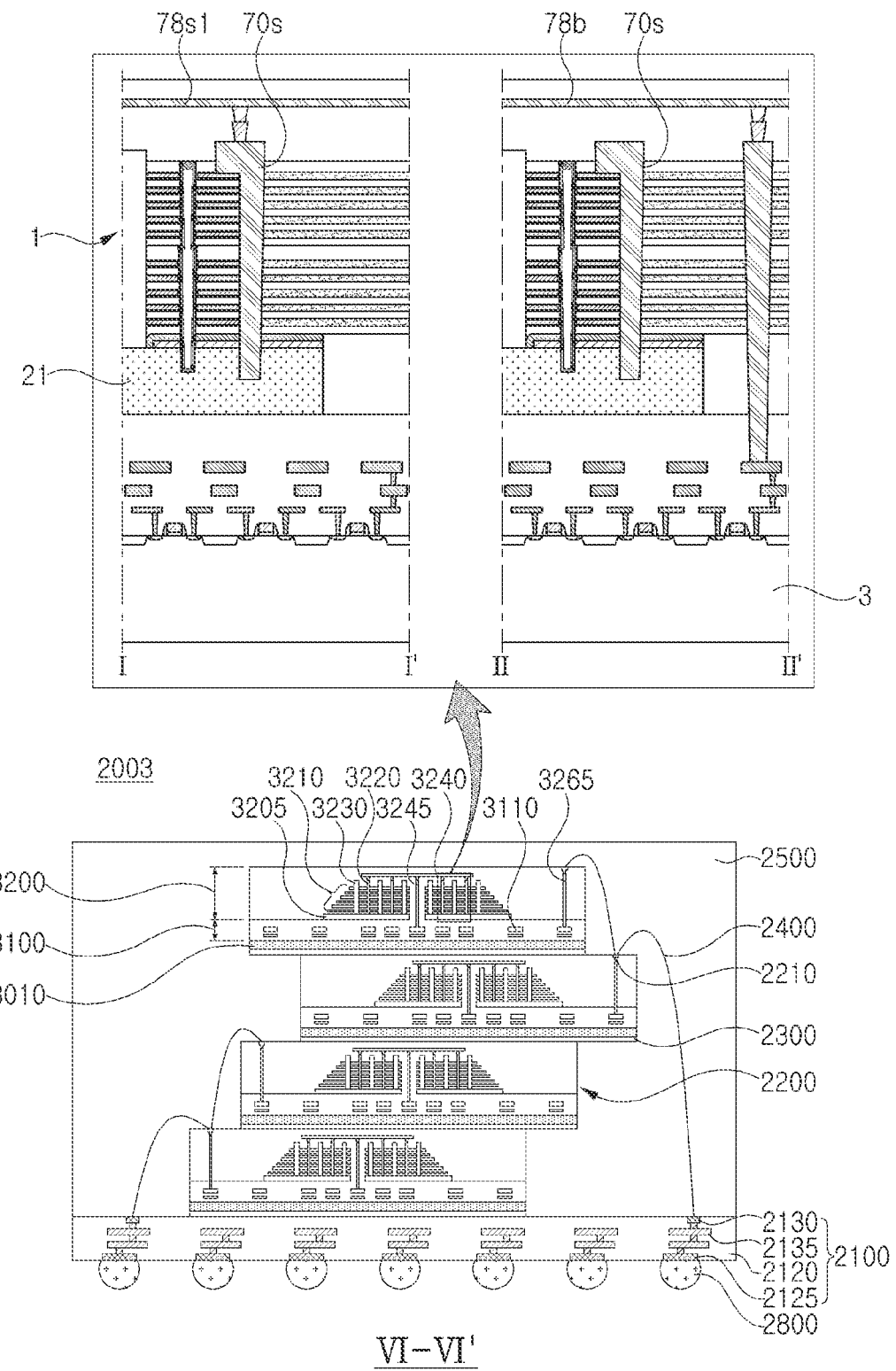
FIG. 23 is a schematic cross-sectional view illustrating a data storage system including a semiconductor device according to some example embodiments.

FIG. 23 is a schematic cross-sectional view illustrating a data storage system including a semiconductor device according to some example embodiments. FIG. 23 illustrates an example embodiment of the semiconductor package 2003 illustrated in FIG. 22, and illustrates a cross-sectional region of the semiconductor package 2003 illustrated in FIG. 22 taken along line VI-VI'.

Referring to FIG. 23, in the semiconductor package 2003, the package substrate 2100 may be configured as a printed circuit board. The package substrate 2100 may include a package substrate body portion 2120, package upper pads 2130 on an upper surface of the package substrate body portion 2120, lower pads 2125 on a lower surface of the package substrate body portion 2120 or exposed through the lower surface, and internal interconnections 2135 electrically connecting the package upper pads 2130 to the lower pads 2125 in the package substrate body portion 2120. The package upper pads 2130 may be electrically connected to the connection structures 2400. The lower pads 2125 may be connected to interconnection patterns 2005 of a main substrate 2001 of the data storage system 2000 through conductive connection portions 2800 as illustrated in FIG. 22.

Each of the semiconductor chips 2200 may include a semiconductor substrate 3010 and a first structure 3100 and a second structure 3200 stacked in order on the semiconductor substrate 3010. The first structure 3100 may include a peripheral circuit region including peripheral interconnections 3110. The second structure 3200 may include a common source line 3205, a gate stack structure 3210 on the common source line 3205, memory channel structures 3220 and separation structures 3230 penetrating through the gate stack structure 3210, bitlines 3240 electrically connected to the memory channel structures 3220, and gate connection lines 93b electrically connected to wordlines (WL of FIG. 21) of the gate stack structure 3210. The first structure 3100 may include the first structure 1100F illustrated in FIG. 21, and the second structure 3200 may include the second structure 1100S illustrated in FIG. 21. For example, of FIG. 23, a partially enlarged region denoted by reference numeral 1 may represent a cross-sectional structure of FIG. 4A. Accordingly, each of the semiconductor chips 2200 may include a semiconductor device 1 according to one of the embodiments described above with reference to FIGS. 1 to 19.

Each of the semiconductor chips 2200 may include a through-interconnection 3245 electrically connected to the peripheral interconnections 3110 of the first structure 3100 and extending into the second structure 3200. The through-interconnection 3245 may penetrate through the gate stack structure 3210 and may be on an external side of the gate stack structure 3210.

Each of the semiconductor chips 2200 may further include an input/output connection line 3265, electrically connected to the peripheral interconnections 3110 of the first structure 3100 and extending inwardly of the second structure 3200, and an input/output pad 2210 electrically connected to the input/output connection line 3265.

As described above, according to some example embodiments, gate electrodes may be vertically stacked to improve integration density of a semiconductor device. Among conductive layers at the same height level as the vertically stacked gate electrodes, at least one conductive layer may be electrically connected to a plate pattern, which may be a common source, through source contact plugs. Therefore, the plate pattern used as a common source of a flash memory device may be electrically connected to a peripheral circuit through at least one of the source contact plugs and the conductive layers, so that noise may be prevented from being generated by the common source during an operation, for example, during a read operation, of the flash memory device. As a result, a semiconductor device having improved integration density and improved electrical performance may be provided.

While example embodiments have been shown and described above, it will be apparent to those skilled in the art that modifications and variations could be made without departing from the scope of the present inventive concepts as defined by the appended claims.

What is claimed is:

1. A semiconductor device comprising:
    a semiconductor substrate;
    a peripheral circuit structure on the semiconductor substrate;
    a plate pattern having a gap and on the peripheral circuit structure;
    a stack structure on the plate pattern and including a first stack region and a second stack region spaced apart from the first stack region, wherein the first stack region includes gate electrodes stacked in a vertical direction that is perpendicular to an upper surface of the semiconductor substrate, wherein the second stack region includes a conductor stack region including conductive layers stacked in the vertical direction, and wherein the second stack region includes an insulator stack region including molded insulating layers at substantially the same height level as the conductive layers;
    a vertical memory structure that extends through the first stack region; and
    source contact plugs electrically connected to at least one of the conductive layers of the conductor stack region and in contact with the plate pattern.

2. The semiconductor device of claim 1, further comprising:
    a bitline on the stack structure; and
    a first peripheral contact plug that extends through at least the insulator stack region and is electrically connected to a first peripheral pad of the peripheral circuit structure;
    a first bitline connection plug that electrically connects the vertical memory structure and the bitline to each other; and
    a second bitline connection plug that electrically connects the first peripheral contact plug and the bitline to each other, wherein:
    the gap has a line shape or a bar shape extending in a first direction that is parallel to the upper surface of the semiconductor substrate; and
    the bitline has a line shape or a bar shape extending in a second direction that is parallel to the upper surface of the semiconductor substrate and is perpendicular to the first direction.

3. The semiconductor device of claim 2, further comprising:
    a first source connection line on the stack structure; and
    a source connection pattern,
    wherein the source contact plugs include at least one first source contact plug that overlap the first source connection line, and second source contact plugs that do not overlap the first source connection line;
    wherein at least one of the second source contact plugs overlaps the bitline;
    wherein the source connection pattern electrically connects the first source connection line with the first source contact plug;
    wherein the first source connection line has a line shape extending in the second direction; and
    wherein a width of the first source connection line is greater than a width of the bitline.

4. The semiconductor device of claim 3, wherein: the width of the first source connection line is about three times to ten times greater than the width of the bitline.

5. The semiconductor device of claim 3, wherein: at least one of the source contact plugs is between the insulator stack region and the conductor stack region; and
    the source connection pattern electrically connects the first source contact plug with the first source connection line.

6. The semiconductor device of claim 3, further comprising:
    first patterns contacting at least an uppermost conductive layer among the conductive layers of the conductor stack region; and
    second patterns electrically connecting the first patterns and the source contact plugs to each other,
    wherein the source contact plugs are electrically connected to at least one of the conductive layers through the first and second patterns; and wherein the source connection pattern is in contact with and electrically connected to a second pattern, electrically connected to the first source contact plug, among the second patterns.

7. The semiconductor device of claim 3, further comprising:
external source contact plugs spaced apart from the first and second stack regions and contacting the plate pattern; and
a second source connection line electrically connecting the external source contact plugs to each other on the external source contact plugs,
wherein the source contact plugs and the external source contact plugs have upper surfaces at an equal distance from the upper surface of the semiconductor substrate; and
wherein the second source connection line and the first source connection line are an equal distance from the upper surface of the semiconductor substrate.

8. The semiconductor device of claim 7, further comprising:
a source peripheral contact plug electrically connected to a source pad of the peripheral circuit structure and having an upper surface having a level farther from the upper surface of the semiconductor substrate than a level of an uppermost gate electrode among the gate electrodes is from the upper surface of the semiconductor substrate;
a first upper interconnection structure electrically connecting the first source connection line with the second source connection line; and
a second upper interconnection structure electrically connecting the first upper interconnection structure with the source peripheral contact plug.

9. The semiconductor device of claim 1, further comprising:
separation structures that extend through the stack structure,
wherein, in a plan view, the separation structures include a first main separation structure and a second main separation structure opposing each other with the gap interposed therebetween;
wherein the second stack region is between the first main separation structure and the second main separation structure; and
wherein the conductor stack region of the second stack region comprises:
a first stack portion between the first main separation structure and the insulator stack region;
a second stack portion between the second main separation structure and the insulator stack region; and
a third stack portion connecting the first stack portion with the second stack portion.

10. The semiconductor device of claim 9, wherein:
the gap has a line shape or a bar shape that extends in a first direction that is parallel to the upper surface of the semiconductor substrate; and
when viewed in a plan view from a height level on which one of the conductive layers is arranged, the third stack portion includes portions convex in a direction toward the insulator stack region.

11. The semiconductor device of claim 9, wherein:
when viewed in a plan view from a height level of one of the conductive layers, a first boundary between the first stack portion and the insulator stack region and a second boundary between the second stack portion and the insulator stack region are in a form of a line extending in a first direction that is parallel to the upper surface of the semiconductor substrate; and
a third boundary between the third stack portion and the insulator stack region extends in a second direction that is parallel to the upper surface of the semiconductor substrate and perpendicular to the first direction.

12. The semiconductor device of claim 9, further comprising:
a source connection line on the stack structure,
wherein the source contact plugs include first side source contact plugs that extend through the first stack portion, second side source contact plugs that extend through the second stack portion, and third side source contact plugs that extend through the third stack portion; and
wherein the source connection line overlaps at least one of the first side source contact plugs and overlaps at least one of the second side source contact plugs.

13. The semiconductor device of claim 1, wherein:
a first of the source contact plugs is elongated in a first direction that is parallel to the upper surface of the semiconductor substrate and a second of the source contact plugs is elongated in a second direction that is parallel to the upper surface of the semiconductor substrate and perpendicular to the first direction.

14. The semiconductor device of claim 1, wherein:
at least one of the source contact plugs is in contact with two or more of the conductive layers.

15. The semiconductor device of claim 1, wherein:
at least one of the conductive layers has an upper surface and a side surface in contact with at least one of the source contact plugs.

16. The semiconductor device of claim 15, wherein:
the at least one of the conductive layers has a lower surface in contact with the at least one of the source contact plugs.

17. The semiconductor device of claim 1, wherein:
each of the source contact plugs includes a slope change portion at which a slope of a side wall thereof is changed, the slope change portion at a level higher than a level of an uppermost gate electrode among the gate electrodes.

18. The semiconductor device of claim 1, further comprising:
vertical support structures penetrating through the conductor stack region.

19. A semiconductor device comprising:
a semiconductor substrate;
a peripheral circuit structure on the semiconductor substrate;
a plate pattern on the peripheral circuit structure and having gaps therein that are spaced apart from each other;
a stack structure on the plate pattern and including first stack regions spaced apart from each other and second stack regions spaced apart from each other, wherein each of the first stack regions includes gate electrodes stacked in a vertical direction that is perpendicular to an upper surface of the semiconductor substrate, wherein each of the second stack regions includes a conductor stack region including conductive layers stacked in the vertical direction, and wherein each of the second stack regions includes an insulator stack region including molded insulating layers at substantially the same height level as the conductive layers;
vertical memory structures that extend through the first stack regions;

source contact plugs that extend through the second stack regions;
separation structures that extend through the stack structure;
source connection lines having a higher level than the stack structure; and
bitlines having a higher level than the stack structure, wherein:
when viewed in a plan view, each of the gaps has a line shape or a bar shape that extend in a first direction that is parallel to the upper surface of the semiconductor substrate;
when viewed in the plan view the first and second stack regions are spaced apart from each other in a second direction that is parallel to the upper surface of the semiconductor substrate and perpendicular to the first direction;
the insulator stack regions of the second stack regions overlap the gaps;
in each of the second stack regions, at least one of the conductive layers of the second stack region is electrically connected to the source contact plugs that extend through the second stack region;
each of the source connection lines has a line shape that extends in the second direction;
each of the bitlines has a line shape that extends in the second direction; and
the source contact plugs include first source contact plugs that overlap the source connection lines, and second source contact plugs that overlap the bitlines.

20. A data storage system comprising:
a semiconductor device including an input/output pattern; and
a controller electrically connected to the semiconductor device through the input/output pattern and configured to control the semiconductor device, wherein:
the semiconductor device comprises:
  a semiconductor substrate;
  a peripheral circuit structure on the semiconductor substrate;
  a plate pattern on the peripheral circuit structure and having gaps spaced apart from each other;
  a stack structure on the plate pattern and including first stack regions spaced apart from each other and second stack regions spaced apart from each other, wherein each of the first stack regions includes gate electrodes stacked in a vertical direction that is perpendicular to an upper surface of the semiconductor substrate, wherein each of the second stack regions includes a conductor stack region including conductive layers stacked in the vertical direction, and wherein each of the second stack regions includes an insulator stack region including molded insulating layers disposed at substantially the same height level as the conductive layers;
vertical memory structures that extend through the first stack regions;
source contact plugs that extend through the second stack regions;
separation structures that extend through the stack structure;
source connection lines having a higher level than the stack structure; and
bitlines having a higher level than the stack structure, wherein:
when viewed in a plan view, each of the gaps has a line shape or a bar shape that extend in a first direction that is parallel to the upper surface of the semiconductor substrate;
when viewed in the plan view, the first and second stack regions are spaced apart from each other in a second direction that is parallel to the upper surface of the semiconductor substrate and perpendicular to the first direction;
the insulator stack regions of the second stack regions overlap the gaps;
in each of the second stack regions, at least one of the conductive layers of the second stack region is electrically connected to the source contact plugs that extend through the second stack region;
each of the source connection lines has a line shape that extends in the second direction;
each of the bitlines has a line shape that extends in the second direction; and
the source contact plugs include first source contact plugs that overlap the source connection lines and second source contact plugs that overlap the bitlines.

* * * * *